(12) United States Patent
Kremin et al.

(10) Patent No.: US 11,531,435 B2
(45) Date of Patent: Dec. 20, 2022

(54) LOW-EMISSIONS TOUCH CONTROLLER

(71) Applicant: Cypress Semiconductor Corporation, San Jose, CA (US)

(72) Inventors: Viktor Kremin, Lviv (UA); Oleksandr Pirogov, Lviv (UA); Jens Weber, Munich (DE); Yarsolav Lek, Lviv (UA); Daniel O'Keeffe, Whitechurch (IE); Brendan Lawton, Cork (IE); Khosrov D Sadeghipour, Cork (IE); Gaurav Panchanan, Cork (IE); Andrew Kinane, Slane (IE)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 17/575,764

(22) Filed: Jan. 14, 2022

(65) Prior Publication Data
US 2022/0197435 A1 Jun. 23, 2022

Related U.S. Application Data

(63) Continuation of application No. 17/026,045, filed on Sep. 18, 2020, now Pat. No. 11,226,706.

(60) Provisional application No. 62/960,474, filed on Jan. 13, 2020.

(51) Int. Cl.
*G06F 3/044* (2006.01)
*G06F 1/03* (2006.01)
*G06F 3/041* (2006.01)
*H03M 3/00* (2006.01)

(52) U.S. Cl.
CPC .......... *G06F 3/0445* (2019.05); *G06F 1/0328* (2013.01); *G06F 3/04166* (2019.05); *G06F 3/04182* (2019.05); *H03M 3/30* (2013.01)

(58) Field of Classification Search
CPC .... G06F 1/0328; G06F 1/1626; G06F 1/1643; G06F 1/1656; G06F 3/0412; G06F 3/04166; G06F 3/04182; G06F 3/04184; G06F 3/0445; G06F 3/0446; H03M 3/30; H01R 13/04; H01R 13/113; H01R 13/502; H01R 13/5202; H01R 13/521; H01R 13/6275; H01R 13/629; H01R 24/60
See application file for complete search history.

(56) References Cited

U.S. PATENT DOCUMENTS

2013/0335367 A1* 12/2013 Kim ...................... G06F 3/0446
                                                        345/174
2014/0306906 A1* 10/2014 Huang .................... G06F 3/045
                                                        345/173
(Continued)

*Primary Examiner* — Chun-Nan Lin

(57) ABSTRACT

Technology directed to low-emissions touch controller in in-cell touch display systems is described. One in-cell touch controller includes a signal generator circuit that is configured to generate a sense signal according to a sensing function, the sense signal including a windowed sinusoidal waveform. The controller generates a transition signal to transition the in-cell touch display between a display function and the sensing function. The controller drives the sense signal and the transition signal on common voltage (VCOM) layer of electrodes during a touch scanning interval. During a display function interval an integrated display driver is configured to drive a first signal on the VCOM layer of electrodes during a display function interval.

21 Claims, 18 Drawing Sheets

(56) References Cited

U.S. PATENT DOCUMENTS

| | | | |
|---|---|---|---|
| 2015/0268778 A1* | 9/2015 | Okamura | G06F 3/0446 |
| | | | 345/173 |
| 2017/0139523 A1* | 5/2017 | Chang | G06F 3/0443 |
| 2018/0120962 A1* | 5/2018 | Hara | G06F 3/0441 |
| 2018/0143726 A1* | 5/2018 | Reynolds | G06F 3/0412 |
| 2018/0143727 A1* | 5/2018 | Reynolds | G06F 3/0445 |
| 2021/0089189 A1* | 3/2021 | Reynolds | G06F 3/0412 |
| 2021/0216168 A1* | 7/2021 | Kremin | G06F 3/0445 |
| 2021/0255727 A1* | 8/2021 | Pirogov | G06F 3/044 |

* cited by examiner

LOW-EMISSIONS TOUCH CONTROLLER

RELATED APPLICATIONS

This application is a continuation of U.S. Non-Provisional application Ser. No. 17/026,045, filed Sep. 18, 2020, which claims the benefit of U.S. Provisional Application No. 62/960,474, filed Jan. 13, 2020, the entire contents of which are incorporated by reference.

BACKGROUND

A touch sensor may be used to detect the presence and location of an object or the proximity of an object within a touch-sensitive area of the touch sensor. For example, touch-sensing circuitry may detect the presence and location of a touch object proximate to a touch sensor disposed in connection with a display screen. There are a number of different types of touch sensors. The types of touch sensor may include resistive touch sensors, surface acoustic wave touch sensors, capacitive touch sensors, inductive touch-sensing, and so forth. The different touch sensors may detect different types of objects.

Most touch-sensing applications require high-sensitivity to support a thick overlay over the touch sensor, operation of the touch sensor using a glove, or high-distance hover recognition at noisy conditions, such as caused by a nearby liquid crystal display (LCD), inductive loads switching, radio emissions, or the like. Moreover, the emission of the touch sensor is limited, which limits the excitation energy of the touch sensor to achieve a sufficient signal-to-noise ratio (SNR).

BRIEF DESCRIPTION OF THE DRAWINGS

The disclosure is illustrated by way of example, and not of limitation, in the figures of the accompanying drawings.

DETAILED DESCRIPTION

Figure 1A:
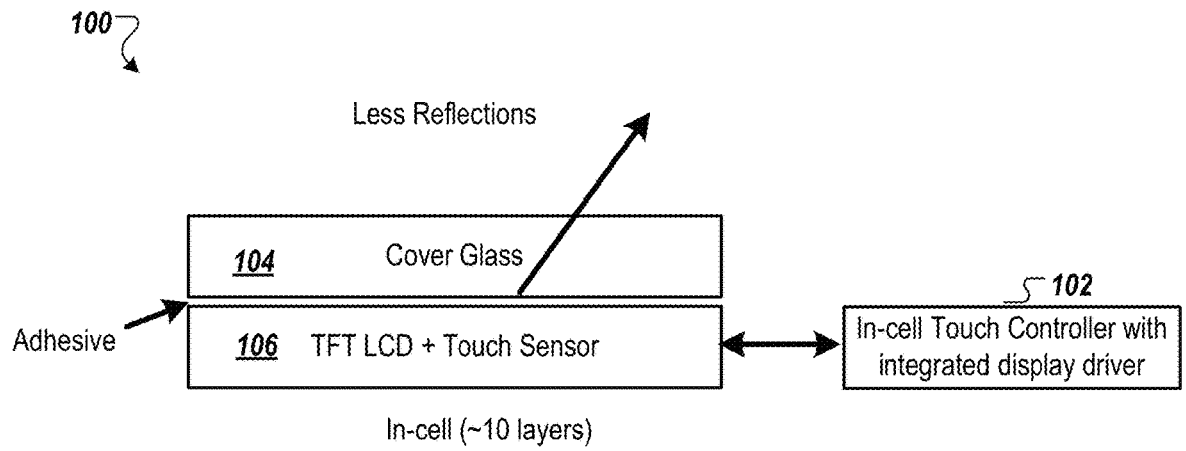
FIG. 1A is a block diagram of an in-cell touch display and an in-cell touch controller with an integrated display driver according to at least one embodiment.

The following description sets forth numerous specific details such as examples of specific systems, components, methods, and so forth, in order to provide a good understanding of various embodiments of the techniques described herein for touch controllers for high touch performance and low emissions. High touch performance can be that the touch controller can meet strict emissions customer requirements while providing the high-performance touch sensing, such as touch, gloves, optional hover, water rejection, or the like. The touch controllers can provide the high-touch performance touch sensing within short scanning cycles, such as provided in an in-cell display panel. An in-cell display panel is a panel with touch and display driver integration (TDDI), where both the underlying display driver and the touch sensor are physically located in a single integrated circuit. An in-cell touch panel can be a panel where the same panel elements (e.g., VCOM layer) are used for the both touch sense functionality and display functionality. The in-cell panel works together with the TDDI circuits, where one integrated circuit combines the display drivers and the touch scanning circuits. A TDDI circuit is glued to an in-cell display panel so that the display itself is a piece of glass with the thin-film transistors (TFTs) and gate-in-panel circuits built in.

For low emissions (e.g. for the automotive applications) for the conventional on-stack touch controllers, there are two common approaches, including multiphase self-capacitance (MPSC). The MPSC method senses self-capacitance using multi-phase excitation and sense patterns. This approach has poor performance in terms of temperature drifts, huge sensitivity to the display (e.g., LCD display), and radio frequency (RF) noise. In particular, the MPSC approach has poor noise rejection of LCD noise and external noise because, during the sensing phase, all sense electrodes of the panel are joined together, acting as a large antenna that senses noise from various sources. The other approach is a floating ground (FGND) method where the entire sensing front end circuitry is floating with a sense signal waveform, as compared to a device or system ground. The FGND approach has excellent sensing and water rejection performance, yet the circuit can be expensive for the multi-channel galvanic isolation or high-voltage level translation. The common approaches are not suitable for in-cell touch controllers in applications like automatic applications that have strict customer requirements for emissions. High in-cell panel capacitance that cannot be easy compensated with the MPSC method and the input current has high sensitivity to the shield electrodes (panel gate and source lines) drive voltage variation. The direct application of the FGND approach in an in-cell design would require a floating analog-front end circuit. That might be difficult to implement in one die integrated with the display driver circuitry, as will require the highs-speed data isolation or level shift. Also, a standard single electrode, self-capacitance method with rectangular excitation signal (i.e., a square signal) cannot be used as it has large radiated emissions due to the impact of higher harmonics that are outside allowed emission limits.

As described above, most of the touch-sensing applications require high-sensitivity, e.g. for the glove touches or for the hover sensing. As described herein the embodiments can provide an increased immunity to external noise by using a windowed sinusoidal waveform and a customer transition waveform between display function intervals and sensing intervals. It will be apparent to one skilled in the art, however, that at least some embodiments may be practiced without these specific details. In other instances, well-known components, elements, or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the present disclosure.

Described herein are various embodiments of techniques for capacitive sensing with an in-cell touch display with low emissions. The embodiments of the in-cell touch controller can provide low emissions that meet strict emission requirements, such as in strict automotive customer requirements, while providing high-performance touch sensing for touch sensing, touch with glove sensing, hover touch sensing, and water rejection within short scanning cycles (e.g., 100-200 microseconds) provided by an in-cell touch display. Just for note, in the in-cell systems there is no display noise as sensing is performed in the quiet intervals, when no display transitions happen. Aspects of the present disclosure can provide high touch performance and low emissions by using any combination of the following technologies: a windowed sinusoidal waveform for the sensing signal, which lowers emissions; a custom transition waveform between a display function and a sensing function, which lowers emissions as well; a combined sensing and transition waveform (display/scan mode transition) to support touch sensing during the transition, which reduces emissions, provides scanning results with a longer scanning time, and provide better signal-to-noise ratio (SNR) for touch sensing; a signal generator that generates a scan waveform with a multi-level sigma-delta modulator with dynamic element matching, which lowers cost of implementation because precision components likely perfectly matched resistors, capacitors or current sources are not needed; phase adjustment of sense channel signals versus shield signals, which lowers uncompensated capacitance, lowers noise, and provide better SNR; floating capacitors for gate driver power supply and lower-phase delay direct current (DC) offset for the gate drivers, which provides design simplicity and lower cost; and other aspects as described herein. SNR can be a number that is indicative of how well a touch signal is separated from noise.

The embodiments may provide a touch sense unit (also referred to as a touch sensor) that may be used in connection with capacitive-sensing circuitry to detect different types of objects. In one embodiment, the sense unit can be used for mutual capacitive sensing or self-capacitance sensing. In one embodiment, the capacitive sensing circuitry (also referred to herein as "capacitive-sensing circuitry" or "sensing circuitry") may use a capacitive touch-sensing channel in a way that it can measure capacitance of the sense element (e.g., a single electrode with respect to a ground potential or between a receive (RX) electrode and a transmit (TX) electrode), as described in more detail herein. The sensing circuitry may also be configured to detect inductance of a sense element, such as to detect ferrous and non-ferrous metal objects proximate to the sense unit using inductive sensing techniques. Examples of devices that may use capacitive sensing may include, without limitation, automobiles, home appliances (e.g., refrigerators, washing machines, etc.), personal computers (e.g., laptop computers, notebook computers, etc.), mobile computing devices (e.g., tablets, tablet computers, e-reader devices, etc.), mobile communication devices (e.g., smartphones, cell phones, personal digital assistants, messaging devices, pocket PCs, etc.), connectivity and charging devices (e.g., hubs, docking stations, adapters, chargers, etc.), audio/video/data recording and/or playback devices (e.g., cameras, voice recorders, hand-held scanners, monitors, etc.), body-wearable devices, and other similar electronic devices.

Reference in the description to "an embodiment," "one embodiment," "an example embodiment," "some embodiments," and "various embodiments" means that a particular feature, structure, step, operation, or characteristic described in connection with the embodiment(s) is included in at least one embodiment of the present disclosure. Further, the appearances of the phrases "an embodiment," "one embodiment," "an example embodiment," "some embodiments," and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

FIG. 1A is a block diagram of an in-cell touch display 100 and an in-cell touch controller 102 with an integrated display driver according to at least one embodiment. In-cell touch display 100 includes a cover glass 104 and a display with an integrated touch sensor 106 with multiple layers. One of the layers is a common voltage (VCOM) layer that serves a dual function. The VCOM layer provides the VCOM voltage to the display elements for a display function during a display interval and serves as the electrodes of the touch sensor for a sensing function during a scanning interval. Display with the integrated touch sensor 106 can be a thin-film transistor (TFT) liquid crystal display (LCD). The TFT LCD includes a VCOM layer of electrodes. In-cell touch controller 102 includes an integrated display driver that drives in-cell touch display 100 during display function intervals and sensing circuitry that performs touch scanning during touch scanning intervals. In-cell touch controller 102 can also aggregate touch data coming from other devices (e.g., slave devices) and can perform touch coordinate calculations or other operations. In-cell touch controller 102 can include touch and display driver integration (TDDI) in which both the underlying display driver and touch sensor circuitry are physical located in a single integrated circuit (also referred to as chip). In-cell touch display 100 can include Gate in Panel (GIP) technology that integrated gate driver circuits in in-cell touch display 100 itself. As described in more detail below, in-cell touch controller 102 includes a signal generator circuit (also referred to as SINEGEN block) that provide a windowed sinusoidal waveform (sinewave) for a sensing signal. For example, a combination of the direct digital synthesis (DDS) and sigma-delta modulation can be used to generate the variable density data stream followed with Low-Pass Filter (LPF) to perform the variable density to the analog signal conversion function. SINEGEN block can be any combination of discrete components, gate circuitry, logic circuitry, digital signal processing (DSP) functional blocks, or the like. DDS is a method of generating sinusoidal or other waveform signals with fine resolution in the frequency. The operations of the DDS can be performed by a DDS circuit. The DDS circuit can be any combination of discrete components, gate circuitry, logic circuitry, DSP functional blocks, or the like. Example DDS circuits are illustrated and described below with respect to the signal generator circuits of FIGS. 5 and 7. The windowed sinusoidal waveform for the sensing signal can lower emissions, for example, by narrowing a frequency peak width. The custom transition waveform between a display function and a sensing function lowers emissions. In some cases, a combined sensing and transition waveform (display/scan mode transition) can support touch sensing during the transition, which reduces emissions, provides scanning results with a longer scanning time, and provides better signal-to-noise ratio (SNR) for touch sensing. The signal generator circuit of in-cell touch controller 102 can generate a scan waveform with a multi-level sigma-delta modulator with dynamic element matching. In-cell touch controller 102 can also provide phase adjustments of sense channel signals versus shield signals in order to lower uncompensated capacitance, reduce noise, and provide better SNR. In-cell touch display 100 can use floating capacitors for gate driver power supply and lower-phase delay DC offset for the gate drivers.

Figure 1B:
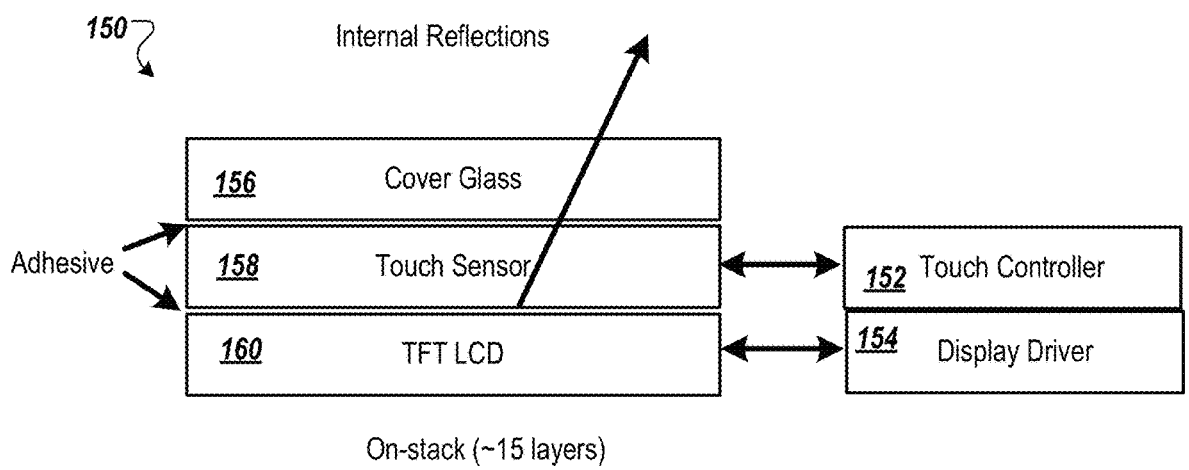
FIG. 1B is a block diagram of an on-stack display with separate touch controller and display driver according to one implementation.

The touch industry has migrated to the in-cell touch display technology of FIG. 1A from on-stack touch technology (also referred to as hybrid on-cell touch technology) as illustrated in FIG. 1B.

FIG. 1B is a block diagram of an on-stack display 150 with separate touch controller 152 and display driver 154 according to one implementation. On-stack display 150 includes a cover glass 156, a touch sensor 158, and a display 160.

In-cell touch display 100 can provide numerous advantages over on-stack display 150 for customers and display makers. For example, as compared to on-stack display 150, in-cell touch display 100 can have higher brightness at a same backlight power, less reflections at the direct sunlight (due to less layers in the stack-up), higher contrast of a display image because of less internal reflections, true black level when a display is off (no visible metal bridges), reduced panel bezel area (as there is no sense electrode routing at the periphery), a thinner overall stack-up, a simpler supply chain (as the complete system comes from one vendor), reduced solution cost (no additional flex to the sense panel and less layers).

In one embodiment, in-cell touch controller 102 includes an integrated display driver and a touch driver. The integrated display driver is configured to drive a first signal on a common voltage (VCOM) layer of electrodes of an in-cell touch display according to a display function during a display function interval. The display driver is considered integrated within in-cell touch controller 102 because the display driver and the touch driver can be part of a single integrated circuit. Also, it should be noted that gate drivers can be integrated into in-cell touch display 100, as described herein. The touch driver includes a sensing channel and a signal generator circuit. The signal generator circuit can be configured to generate a second signal according to a sensing function. The second signal includes a windowed sinusoidal waveform. The signal generator circuit generates a transition signal (also referred to herein as a display/scan mode transition or display/scan mode transition). The transition signal is configured to transition the in-cell display between the display function and the sensing function. The signal generator circuit is also configured to drive the second signal and the transition signal on the VCOM layer during a touch scanning interval.

In a further embodiment, the touch driver is further configured to combine the transition signal and the second signal into a combined output signal and drive the combined output signal on the VCOM layer during the touch scanning interval to support the sensing function during a transition to or from the display function. The touch driver can include a direct digital synthesis (DDS) circuit as described in more detail below for the windowed sinusoidal or other preprogrammed signal waveform generation. For example, in one embodiment, the DDS circuit includes multiple functional blocks, including: a phase accumulator; a first summer; a phase-to-amplitude converter comprising a look-up table (LUT); a multiplier; a sigma-delta modulator (SDM); and a low pass filter (LPF). In another embodiment, the DDS circuit is used in connection with a digitally-controlled potentiometer.

Figure 2:
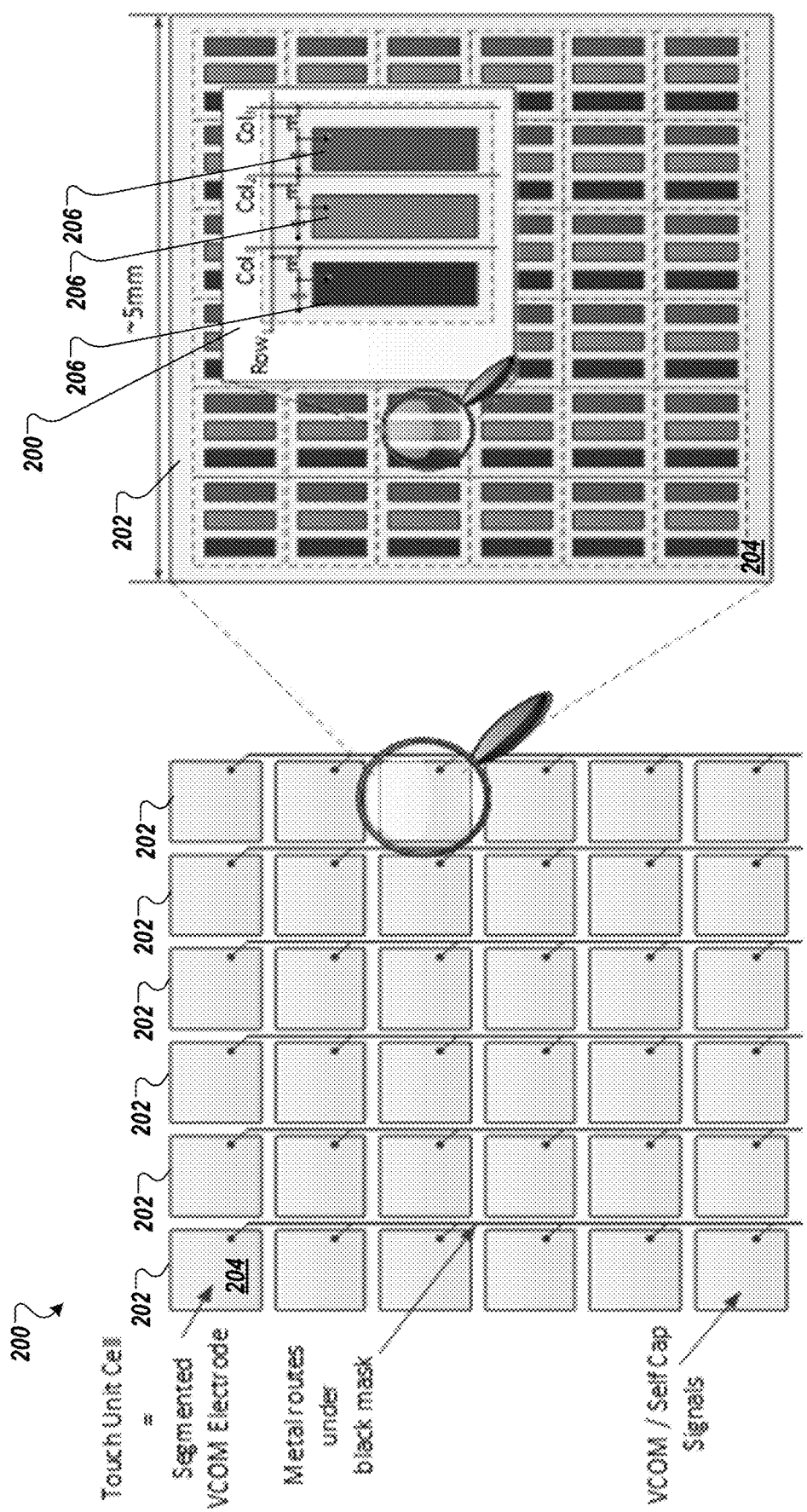
FIG. 2 illustrates multiple touch unit cells of an in-cell touch display according to at least one embodiment.

FIG. 2 illustrates multiple touch unit cells 202 of an in-cell touch display 200 according to at least one embodiment. In-cell touch display 200 can be similar to in-cell touch display 100 described above and can represent more a detailed view for display 100. In-cell touch display 200 includes multiple touch unit cells 202, each of which includes a segmented VCOM electrode 204 which can provide the VCOM voltage during display functions of in-cell touch display 200 and scanning signals (e.g., self-cap signals or sense signals) during sensing functions of in-cell touch display 200. Metal routes from each of the segmented VCOM electrodes can be disposed under black masks of in-cell touch display 200. In-cell touch display 200 also includes multiple display elements 206. The display elements 206 can be organized as sets of three different color elements and multiple sets per each segmented VCOM electrode 204. As described herein, gate drivers can be integrated in in-cell touch display 200, as illustrated in FIG. 2 as coupled to a row and individual columns. Although not illustrated in FIG. 2, it should be noted that gate drivers (e.g., GIP circuits) form row signals for the TFT transistor gates, as illustrated in FIG. 2, and column signals (data lines) come from an in-cell touch controller (e.g., TDDI circuit). As described above with respect to FIG. 1A, an in-cell touch controller can use segmented VCOM electrodes 204 for display functions and sensing functions.

Figure 3:
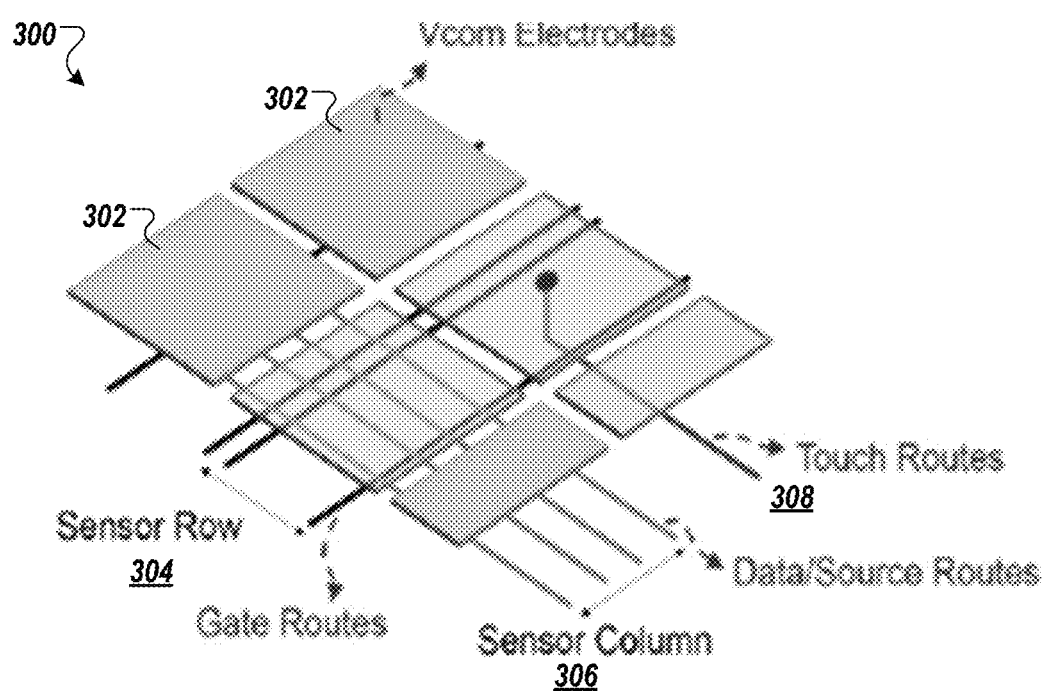
FIG. 3 illustrates multiple common voltage (VCOM) electrodes of an in-cell touch display according to at least one embodiment.

FIG. 3 illustrates multiple VCOM electrodes 302 of an in-cell touch display 300 according to at least one embodiment. VCOM electrodes 302 are coupled to sensor row lines 304, sensor column lines 306, and touch route lines 308. Sensor row lines 304 can provide routes for gate signals (labeled as gate routes) from an in-cell touch controller (not illustrated in FIG. 3). Sensor column lines 306 can provide routes for source signals (labeled as data/source routes) from the in-cell touch controller. Touch route lines 308 can provide routes for sensing signals between each of the multiple VCOM electrodes 302 and the in-cell touch controller for sensing functions.

In-cell touch panels commonly use a Single-Electrode, Self-Capacitance (SE-SC) method for touch sensing with active shielding, as there are big coupling capacitances between the VCOM layer and underneath TFT transistors with a connected gate and source lines, as illustrated in FIG. 3. The phase and amplitude of a shield signal for active shielding is typically equal to a sense signal, but there are possible DC offsets are needed to provide proper levels for the in-panel TFT transistors to prevent the leakage currents to the touch route lines 308 coupled to the RX channel and prevent image quality degradation due to the touch sensor operation. The in-cell touch controller described herein can provide phase and amplitude adjustment of the shield and sense signals.

Because the touch sensor and the display driver functionality are integrated in an in-cell touch display, an in-cell touch controller has much shorter scanning intervals as compared to a touch controller for an on-stack display. For example, typical scanning bursts in an in-cell touch display can be between 100-200 microseconds in length with a burst repeating period of approximately 1.6 milliseconds or so, whereas a scanning time budget for an on-stack display can be up to a full report period (e.g., 8 milliseconds for applications with a typical report rate of 120 Hz). Display function intervals and touch scanning intervals of an in-cell touch controller are illustrated and described below with respect to FIG. 4.

Figure 4:
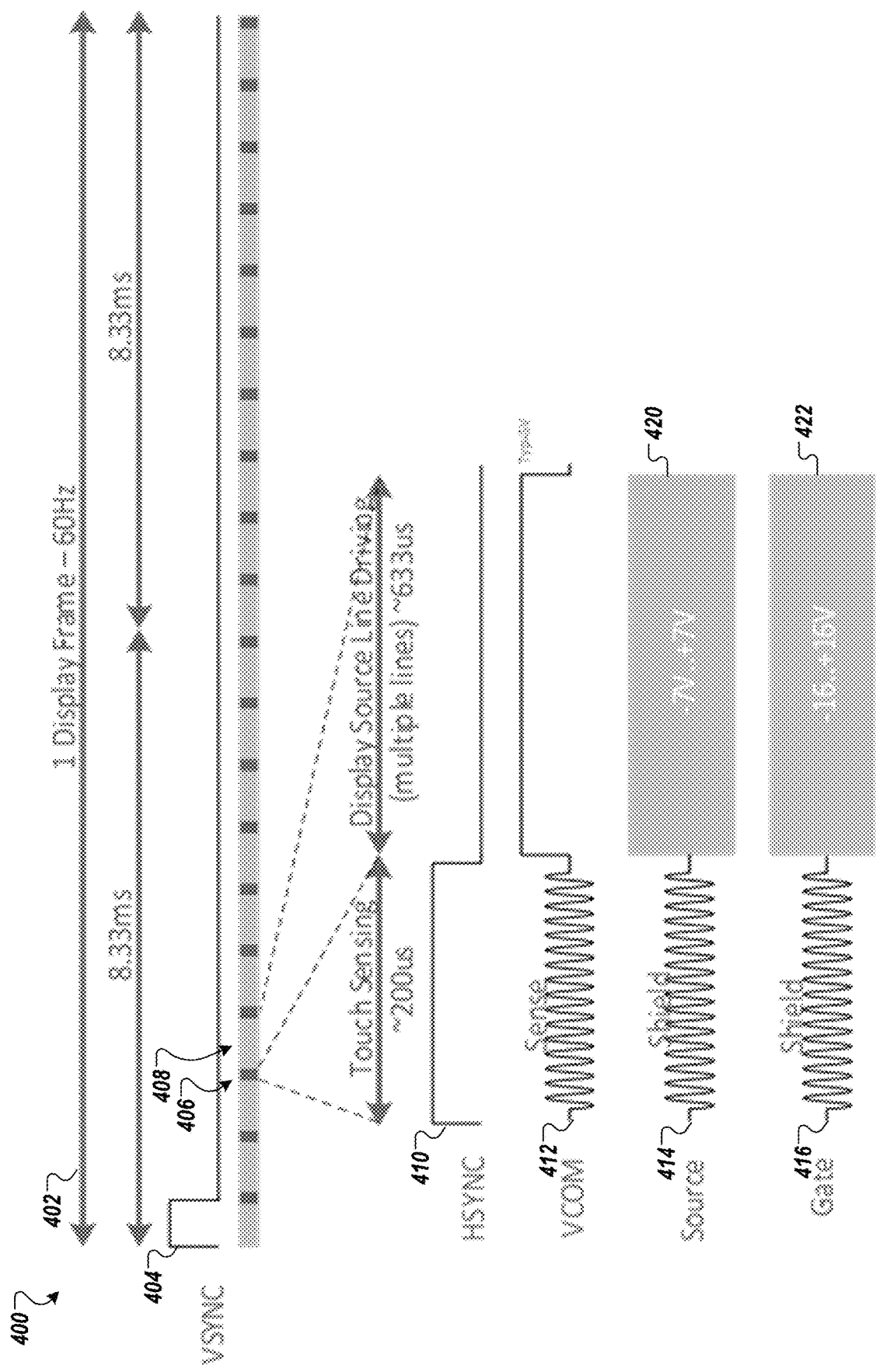
FIG. 4 is a waveform diagram of signals for display functions during display function intervals and sensing functions during touch scanning intervals according to at least one embodiment.

FIG. 4 is a waveform diagram 400 of signals for display functions during display function intervals and sensing functions during touch scanning intervals according to at least one embodiment. Waveform diagram 400 includes a single display frame 402 at 60 Hz, totaling approximately 16.66 milliseconds of time. At a start of the display frame 402, a vertical synchronization (VSYNC) signal 404 is asserted. After VSYNC signal 404 is asserted, touch scanning intervals 406 and display function intervals 408 can alternate multiple times during the display frame 402. As illustrated in the exploded view of one of touch scanning interval 406, a horizontal synchronization (HSYNC) signal 410 is asserted and a sense signal 412 is applied to a VCOM electrode of an in-cell touch display. In addition, a first shield signal 414 is applied to a source line of an integrated display driver and a second shield signal 416 is applied to a gate line of the integrated display driver. As described herein, the phase and amplitude of first shield signal 414 and second shield signal 416 can be equal to sense signal 412 but with some DC offset. These signals, as illustrated in FIG. 4, have sinusoidal waveforms. The sinusoidal waveforms can be generated by a signal generator circuit, such as those illustrated below with respect to FIGS. 5-8. It should be noted that windowing is not illustrated in signals of FIG. 4 for easy of illustration.

At an end of touch scanning interval 406, HSYNC signal 410 is de-asserted and a VCOM voltage 412 is applied to the VCOM electrode. Signals 420 (e.g., −7V to +7V) and signals 422 (e.g., −16V to +16V, which is LCD panel technology dependent) are applied to the source line and gate line, respectively, for display functions. In this example, touch scanning interval 406 can be approximately 200 microseconds and display function interval 408 can be approximately 633 microseconds. Alternatively, other interval lengths are possible for a given display frame.

The signals of FIG. 4 can be generated by an in-cell touch controller where an in-cell touch display includes integrated gate drivers, also referred to as Gate-In-Panel (GIP) circuits. There are some challenges for in-cell touch controllers, such as those listed below in Table 1.

TABLE 1

Key Challenges for In-cell Touch Controllers

| Challenge | Details |
| --- | --- |
| Short touch scanning cycles | Short touch scanning cycles can be susceptible to a weak touch signal and poor SNR |
| Integration with display drive circuits on one die | Integration can cause high-voltage display drive with low-noise sensing circuits with one CMOS process technology |
| High sensor load capacitance due to the large capacitive coupling to the gate and source lines in the in-cell structure | The total touch sensor load (VCOM) can be ~3 ÷ 6 nF to the gate and source lines for 15" panel |
| High panel loading to the system chassis | ~1 nF for the 15" panel, depends on the airgap to the shield behind display |
| The need of the multiple shield signals with different DC offsets | 3× signals: the 1× VCOM shield the same as the sense signal, 2× shielded GIP signals with own DC offsets |
| A long distance to the decoupling capacitors due to the bouding the TDDI chip to the glass. | 30 . . . 50 mm far away from the decoupling capacitors |

Aspects of the present disclosure address these challenges by using a combination of technologies, as set forth in Table 2.

TABLE 2

Technologies for In-cell Touch Controllers

| Technology | Example Benefit |
| --- | --- |
| Uses a windowed sinusoidal sense waveform | The narrower central peak that results in lower emissions |
| Uses a custom transition waveform between the display function and touch sense | Lower overall emissions |
| Provides touch sensing during a display/scan mode transition to reduce emissions | Lower emissions as scanning burst takes longer and a better touch SNR for the same reason |
| Generates a scan waveform with the help of the multi-level sigma-delta modulator with dynamic elements matching | Low-cost implementation, does not need precision components (single value resistors, tolerate high component tolerances) |
| Multiplies sinewave sources with an individually programmable output signal phase and amplitude | Lower uncompensated capacitance, resulting in smaller noise and a better touch SNR |

TABLE 2-continued

Technologies for In-cell Touch Controllers

| Technology | Example Benefit |
| --- | --- |
| Floating caps for the gate driver power supply and low-phase delay DC-offset for the gate/drivers | The ability to generate a shield signal with multiple DC-offsets for the gate driver circuit provides the design simplicity and reduces overall costs |
| A programmable sinewave LPF bandwidth | To control the LPF phase misalignment |
| Programmable sinewave amplitude | To control the absolute emission and sensitivity |
| A Linear and Large-signal load driver | To meet the low-electromagnetic interference (EMI) requirement on different panel sizes |
| High PSR on the single-ended sinewave output | Less sensitivity to the power-supply noise, because decoupling capacitors are far away in the in-cell design |

As set forth above, one technology in the embodiments of an in-cell touch controller, is a low-distortion sinusoidal signal-source (SINEGEN), referred to herein as a signal generator circuit. The signal generator circuit keeps low system emissions and enables passing strict customer emission requirements. The signal generator circuit can be implemented in an existing semiconductor processing that is used for high-voltage display driver implementations. The signal generator circuit can generate a low-distortion windowed sinewave signal. The signal generator circuit can provide transitions between a sensing function (touch scan) and display functions. The signal generator circuit can support scanning during the transition in some cases too. The signal generator circuit can handle a high panel load. The signal generator circuit can implement a DDS method, such as illustrated and described below with respect to FIG. 5. In some cases, a smooth scan-display function transition reduces wideband panel emission and a windowed sinusoidal sense waveform is results in narrowband emission, where an emission peak is outside customer emission limits, e.g. 100 kHz.

Figure 5:
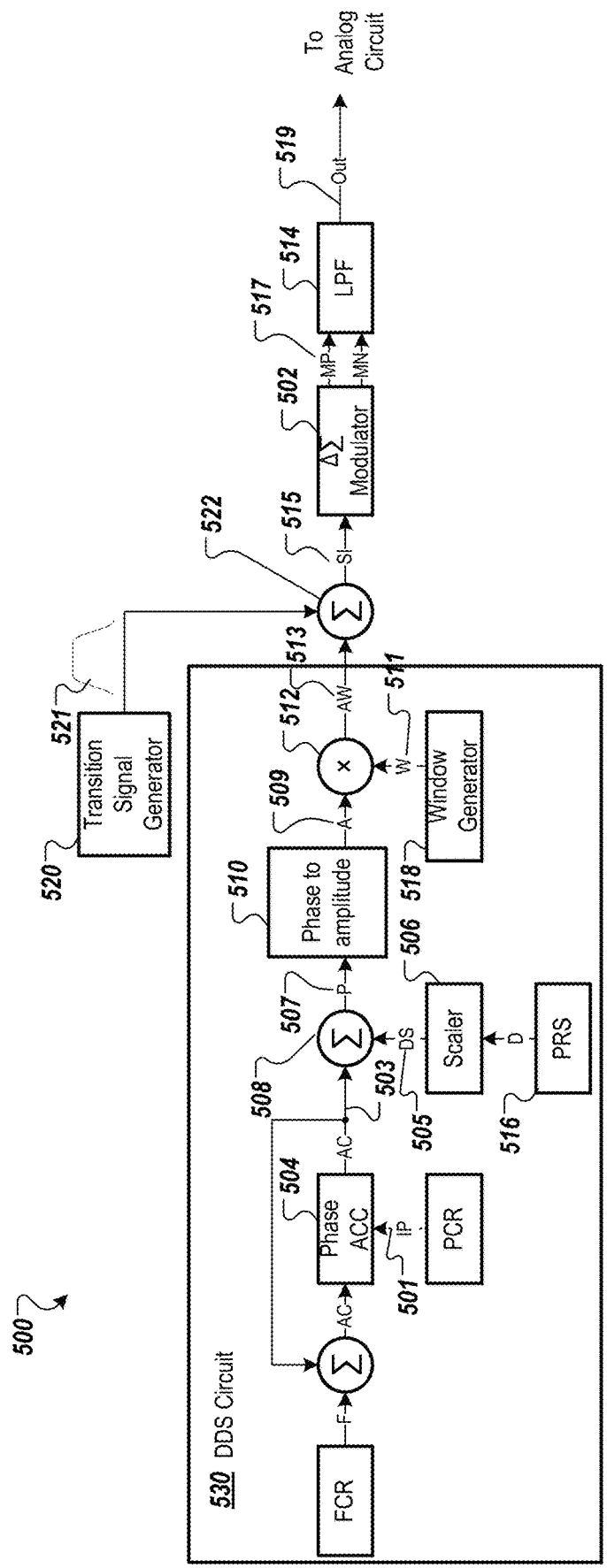
FIG. 5 is a functional diagram of functional blocks of a signal generator circuit with a sigma-delta modulator (SDM) according to at least one embodiment.

FIG. 5 is a functional diagram of functional blocks of a signal generator circuit 500 with a DDS circuit 530 and a sigma-delta modulator (SDM) 502 according to at least one embodiment. DDS circuit 530 includes a phase accumulator 504, a dithering circuit 506 and 516, a first summer 508, a phase-to-amplitude converter 510, including a look-up table (LUT), a multiplier 512, the SDM 502, and a low pass filter (LPF) 514. Phase accumulator 504 sums a phase value 501, such as stored as an initial phase in a phase control register (PCR), each clock cycle to obtain an accumulated phase value 503. Phase accumulator 504 can feedback a current value to be summed at a frequency set by a frequency control register (FCR). Dithering circuit 506 and 516 generates a dithering signal 505. Dithering signal 505 can be generated based on a pseudo-random number from a pseudo-random source 516. First summer 508 sums accumulated phase value 503 and dithering signal 505 to obtain a phase signal 507. Phase-to-amplitude converter 510 converts phase signal 507 to an amplitude signal 509 using a look-up table (LUT). The look-up table operation converts the phase signal to the selective waveform. This conversion can be a linear or non-linear conversion, depending on the preprogrammed into LUT values. Multiplier 512 multiplies amplitude signal 509 by a windowing signal 511 to obtain windowed sinusoidal waveform 513. Windowing signal 511 can be generated by a window generator 518. Window generator 418 can be done using a Tukey window function or other window functions.

In this embodiment, the signal generator circuit 500 includes a transition signal generator 520 and a second summer 522. Transient signal generator 520 generates a transition signal 521 and second summer 522 combines transition signal 521 and windowed sinusoidal waveform 513 into a combined signal 515 that is fed to SDM 502. Combining transition signal 521 and windowed sinusoidal waveform 513 provides display function/scanning function transitions that use a signal profile, like Tukey window.

SDM 502 can be a multi-level SDM with a differential or single-ended output 517. SDM 502 converts input numerical data in combined signal 515 into a density-modulated stream. Differential output 517 is passed to LPF 514 that filters differential output 517 to obtain an output signal 519 that is passed to an analog output-stage, as described in more detail below.

As described above, the signal generator circuit includes a SDM in a digital domain. In another embodiment, a digitally-controlled potentiometer can be used, such as illustrated and described below with respect to FIG. 7.

Figure 6:
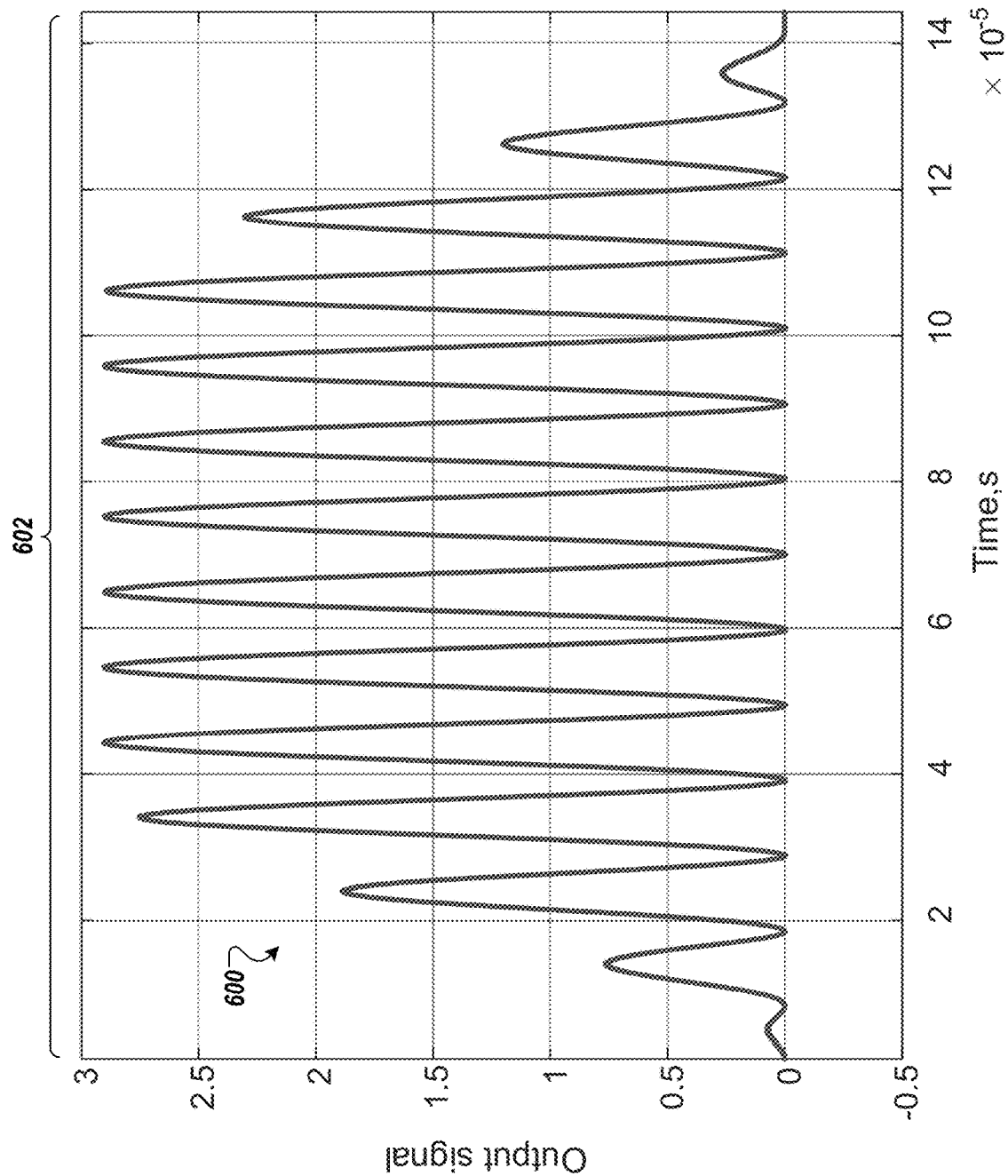
FIG. 6 is a waveform diagram illustrating an output signal with combined scanning and transition signals according to at least one embodiment.

FIG. 6 is a waveform diagram illustrating an output signal 600 with combined scanning and transition signals according to at least one embodiment. Output signal 600 corresponds to output signal 519 of FIG. 5. As described above, output signal 600 includes both a sense signal and a transition signal. The sense signal is a signal used for a sensing function. The transition signal is a signal to transition between a display function and a sensing function. There may be different levels for the display function and the sensing functions in some in-cell panels and a transition signal can transition between the different levels.

During operation, an in-cell touch controller, using signal generator circuit 500, drives output signal 600 during a touch scanning interval 602. Since the output signal 600 combines a sense signal and a transition signal, the in-cell touch controller can support sensing during the transition between the display function and the sensing function. That is, the scanning function can be longer in duration during the touch scanning interval 602 by combining the sense signal and the transition signal.

In another embodiment, during operation, an in-cell touch controller, using signal generator circuit 500, drives a first portion of the transition signal during a first segment of the touch scanning interval and a second portion of the transition signal during a second segment of the touch scanning interval. The in-cell touch controller also drives a sense signal (also referred to herein as a second signal) during a third segment of the touch scanning interval, the third segment being after the first segment and before the second segment. In another embodiment, the transition signal can be driven in just a first segment, while the sense signal is driven in a second segment after the first segment (e.g., at a beginning of the touch scanning interval). In another embodiment, the transition signal can be driven in just a first segment, while the sense signal is driven in a second segment before the first segment (e.g., at an end of the touch scanning interval).

Figure 7:
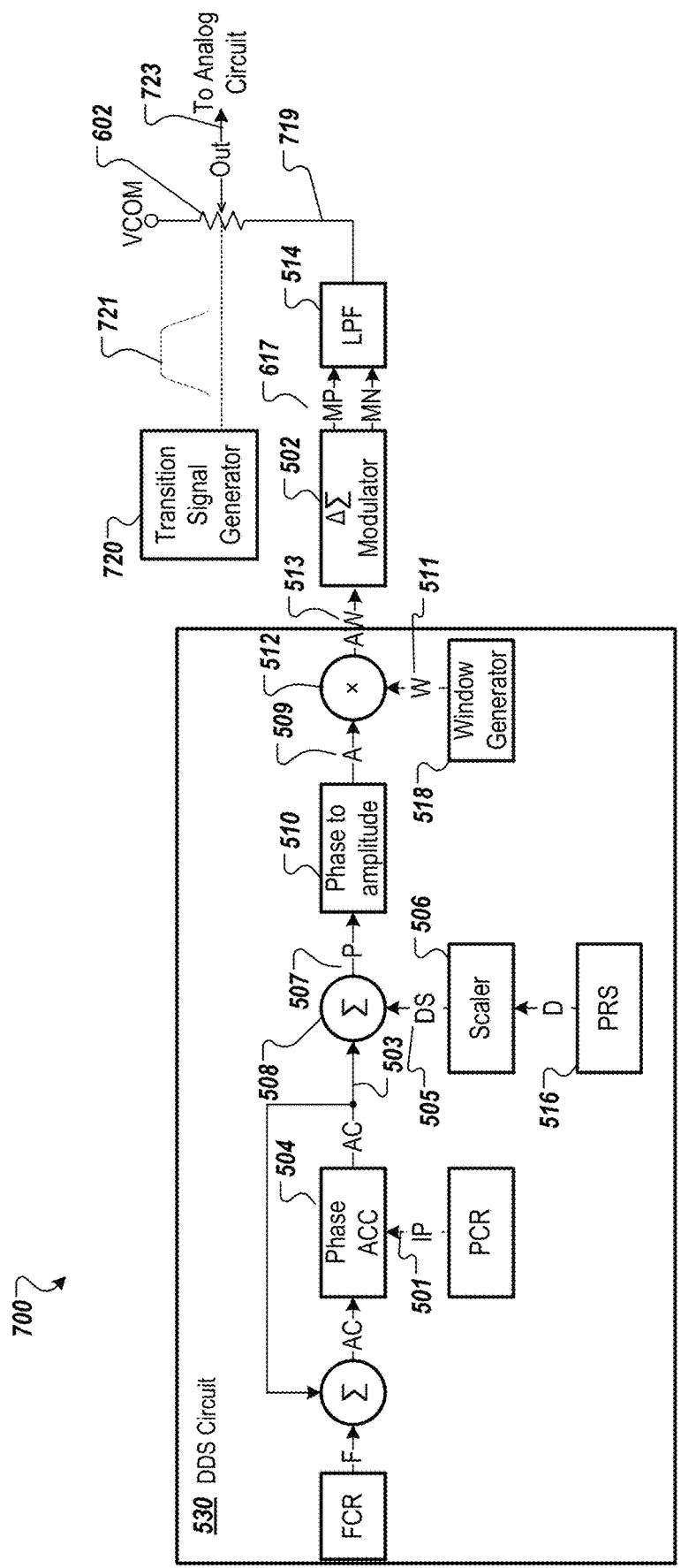
FIG. 7 is a functional diagram of functional blocks of a signal generator circuit with a sigma-delta modulator (SDM) and a digitally-controlled potentiometer according to at least one embodiment.

FIG. 7 is a functional diagram of functional blocks of a signal generator circuit 700 with a DDS circuit 530, a SDM 502, and a digitally-controlled potentiometer 702 according to at least one embodiment. DDS circuit 500 is similar to signal generator circuit 500 as noted by similar reference numbers. However, instead of summing transition signal 521 with windowed sinusoidal waveform 513 by second summer 522 as done in signal generator circuit 500, signal generator circuit 700 passes windowed sinusoidal waveform 513 to the SDM 502 and SDM 502 converts the input numerical data in windowed sinusoidal waveform 513 into a density-modulated stream as differential output 517. Differential output 717 is passed to LPF 514 that filters differential output 717 to obtain an analog output signal 719. Digitally-controlled potentiometer 702 receives output signal 719 and a transition signal 721 from a transition signal generator 720. Transition signal 721 provides display function/scanning function transitions that use a signal profile, like Tukey window. A center pin of digitally-controlled potentiometer 702 is controlled by a control signal to output an output signal 723 based on either transition signal 721 from transition signal generator 720 or output signal 719 from LPF 514. In one embodiment, a center pin of digitally-controlled potentiometer 702 acts as a summing point for a LPF output and VCOM and output signal 723 gradually transition between the LPF output and VCOM under control of signal generator circuit 700. Control of this movement is provided by a transition data generator. In one embodiment, signal generator circuit 700 can operate like a DJ fader of digitally-controlled potentiometer 702 to provide a smooth transition. Output signal 723 is passed to an analog output-stage, as described in more detail below.

Figure 8:
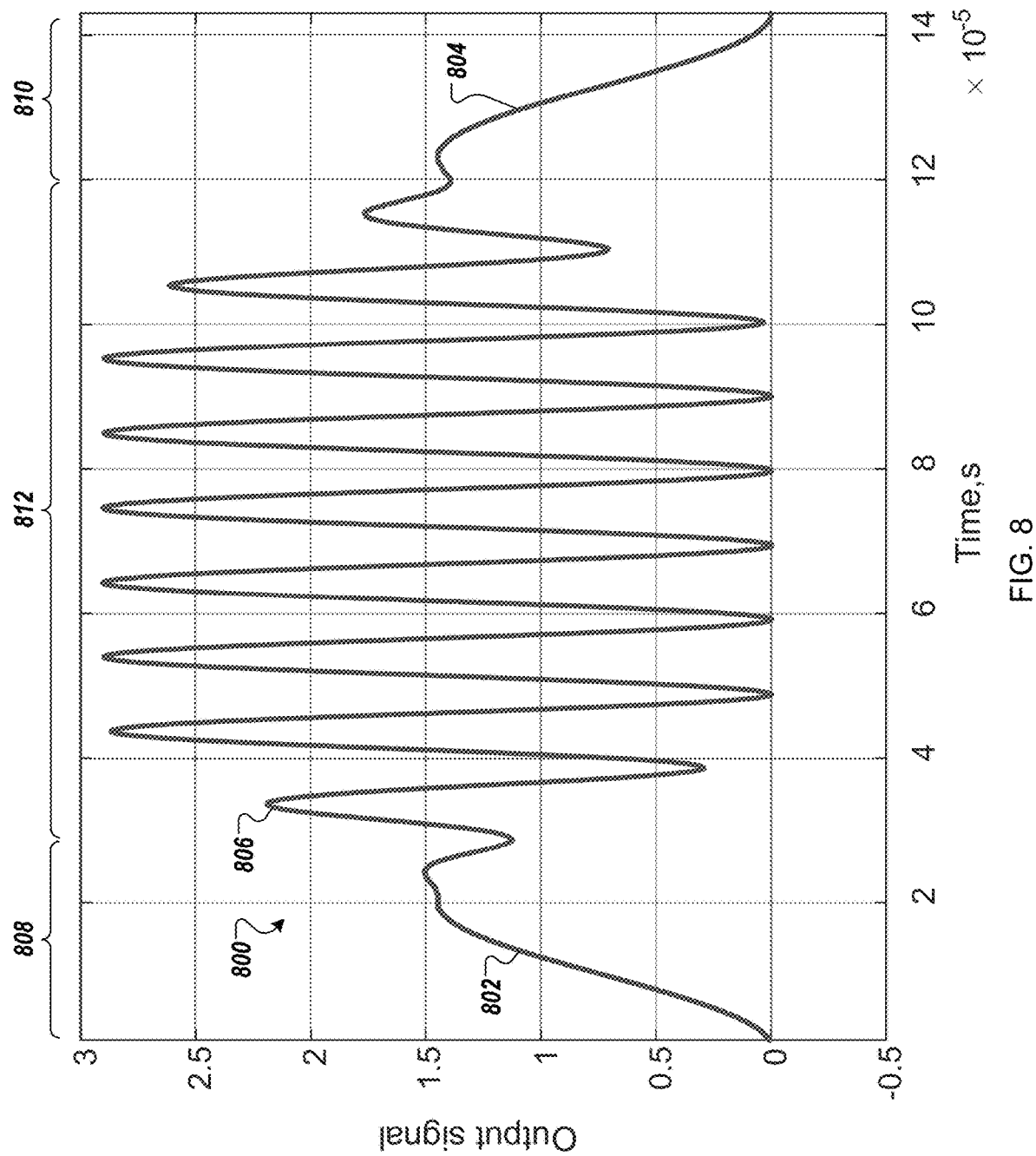
FIG. 8 is a waveform diagram illustrating an output signal with separated scanning and transition signals according to at least one embodiment.

FIG. 8 is a waveform diagram illustrating an output signal 800 with separated scanning and transition signals according to at least one embodiment. Output signal 800 corresponds to output signal 723 of FIG. 7. As described above, output signal 800 includes separate sense and transition signals. The sense signal is a signal used for a sensing function. The transition signal is a signal to transition between a display function and a sensing function, as well as to transition between the sensing function and the display function.

During operation, an in-cell touch controller, using signal generator circuit 700, drives a first portion 802 of the transition signal during a first segment 808 of the touch scanning interval and a second portion 804 of the transition signal during a second segment 810 of the touch scanning interval. The in-cell touch controller also drives a sense signal 806 (also referred to herein as a second signal) during a third segment 812 of the touch scanning interval, third segment 812 being after first segment 808 and before second segment 810. In another embodiment, the transition signal can be driven in just first segment 808, while sense signal 806 is driven in third segment 812 after first segment 808 (e.g., at a beginning of the touch scanning interval). In another embodiment, the transition signal can be driven in just second segment 810, while sense signal 806 is driven in third segment 812 before second segment 810 (e.g., at an end of the touch scanning interval).

Figure 9:
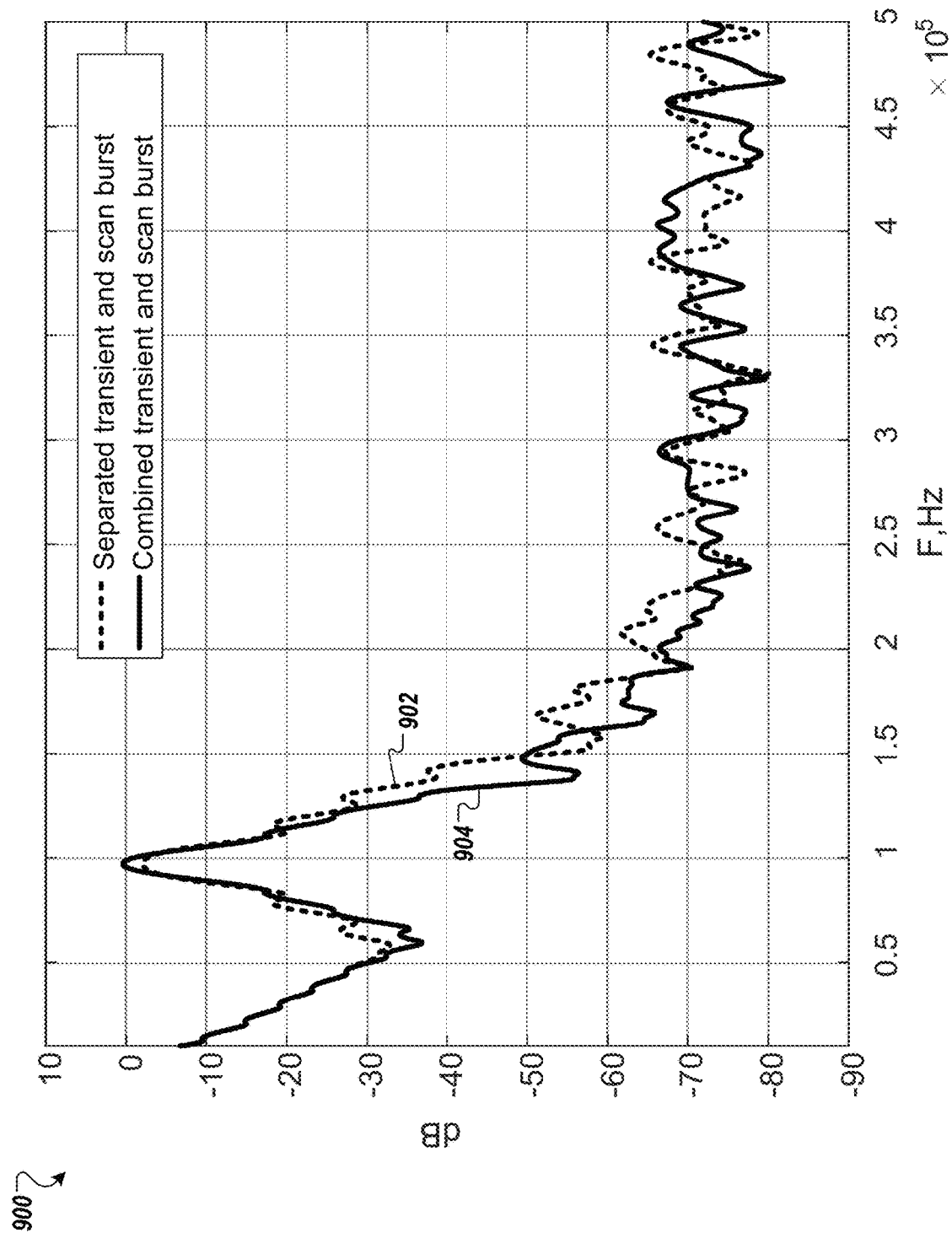
FIG. 9 is a spectrum plot illustrating frequency spectrum comparisons of the separated scanning and transition signals and the combined scanning and transition signals according to at least one embodiment.

FIG. 9 is a spectrum plot 900 illustrating frequency spectrum comparisons of the separated scanning and transition signals 902 and the combined scanning and transition signals 904 according to at least one embodiment. Graph 900 shows that combining the transition signal (mode combined transition with scan) with scanning signals, a longer burst duration of scanning can be achieved, as indicated by approximately 3 dB stronger touch signals for the combined scanning and transition signals 904 and the combined scanning and transition signals 904 having a narrower peak width with approximately 10 dB at some frequencies due to the longer overall burst duration.

Figure 10A:
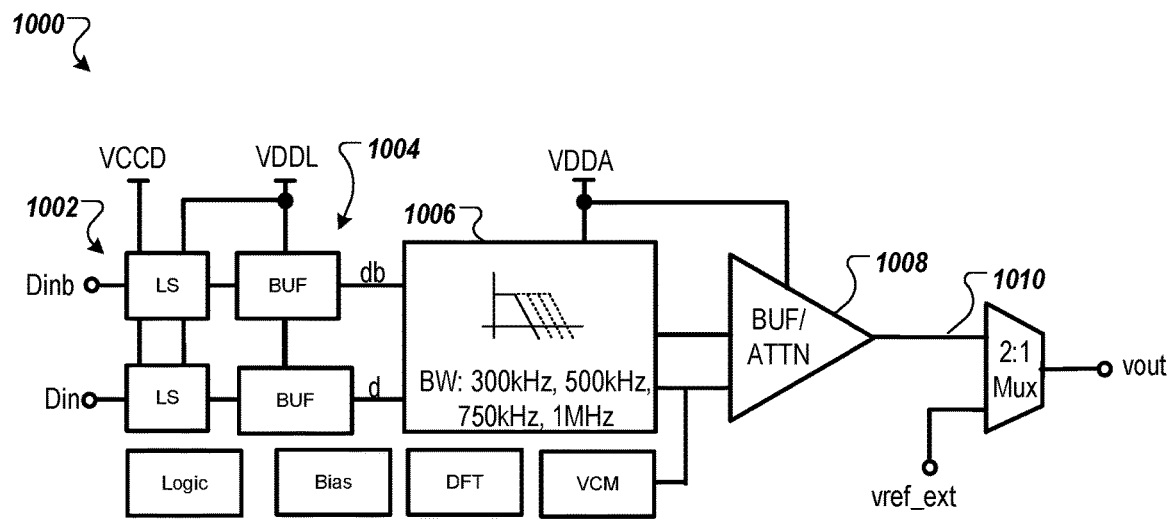
FIG. 10A is a block diagram of an analog output stage circuit of the signal generator circuit according to at least one embodiment.

FIG. 10A is a block diagram of an analog output stage circuit 1000 of the signal generator circuit according to at least one embodiment. Analog output stage circuit 1000 includes level shifters 1002, buffers 1004, a programmable LPF 1006 with a programmable bandwidth, and an output analog buffer and attenuator 1008. Level shifters 1002 receive input signals (input data (Din) and inverted balanced data (Dinb)) and transitions the input signals between different levels depending on the different domains signal. Level shifters 1002 output the level-shifted signals to buffers 1004. The buffers 1004 are powered from low-noise power supply VDDL. The digital logic is powered by the VCCD supply that might be noisy. The LPF 1006 has two equal value resistor strings, performing with help of other passive components feature of multi-level SDM density-to-analog conversion and low-pass filtering at the same time.

Using programmable LPF 1006 and output analog buffer and attenuator 1008, analog output stage circuit 1000 generates low-distortion signals 1010 in a wide range of output frequencies and output voltages than enable handling panels that operate at various frequencies and voltages.

In some embodiments, there can be a few supplemental elements, like synchronization logic can be part of the level shifters that re-samples the SDM data stream and can align the multiple SDM levels change at the same time to mitigate impact of the different signal routing time. In another embodiment, logic can include Dynamic Elements Match (DEM) logic that shuffles multiple data levels in real time, enabling reaching excellent Spurious-Free-Dynamic Range (SFDR) with help of the components that have large tolerances, e.g. resistors in the LPF that have 10% tolerances. The bias sources can provide the bias current for the operation amplifiers (as part of the LPF) and analog buffer/attenuator. The common mode voltage source (VCM) can generate a DC offset (common mode voltage, e.g. half of the VDDL) for the LPF, enabling system operating from single polarity power supply. The Design For Test (DTF) circuits can enable performing individual block characterization tests during chip sample characterization or as part of the volume manufacturing test program. The 2:1 multiplexer can accept the vref_ext signal, which can be used to switch for a rectangular signal excitation scheme, e.g. when no strict emission requirements are from a customer side, for example, for the consumer or some industrial electronics products.

Figure 10B:
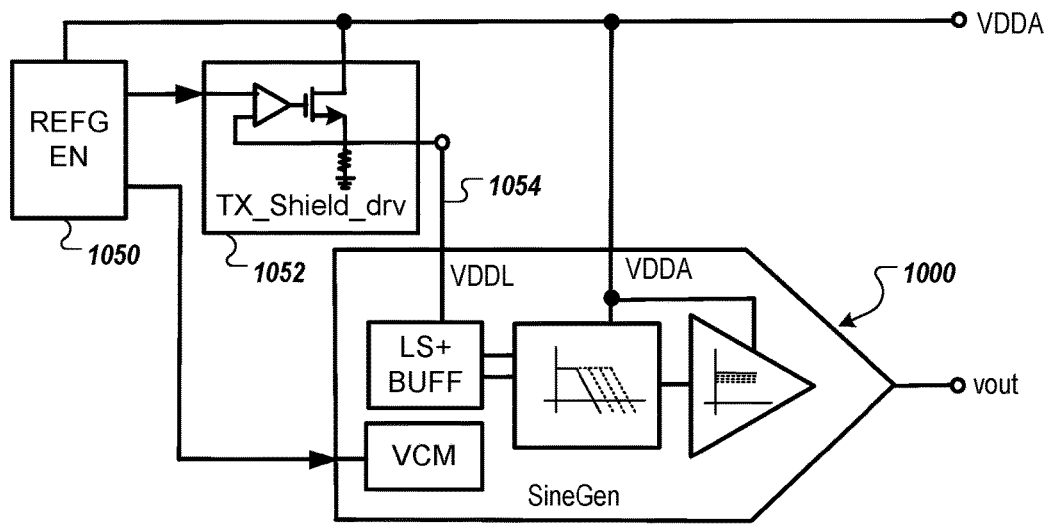
FIG. 10B is a block diagram of an analog output stage circuit and a reference generator and a shield driver according to at least one embodiment.

FIG. 10B is a block diagram of an analog output stage circuit 1000 and a reference generator 1050 and a shield driver 1052 according to at least one embodiment. In this embodiment, reference generator 1050 generates a reference signal to analog output stage circuit 1000. The reference signal can also be applied to shield driver 1052, which compares the reference signal against an output signal 1054 (VDDL) from level shifters 1002 of analog output stage circuit 1000.

As described herein, aspects of the present disclosure can provide substantial improvements or advantages over other solutions by providing a lower solution cost (smaller die area, lower power consumption) by using the low-cost sinewave generation techniques described herein, such as the multi-level sigma-delta modulation with dynamic elements matching, as compared to higher-speed digital-to-analog converters (DAC) that are expensive to achieve high performance. As described herein, aspects of the present disclosure can provide substantial improvements or advantages over other solutions by providing lower radiated emissions due to using a signal windowing technique, for example, using smooth and long enough (e.g., 20 microseconds or more) transitions between display function and sensing functions for VCOM signals. As described herein, aspects of the present disclosure can provide substantial improvements or advantages over other solutions by combining the touch burst and VCOM transition in one waveform. As described herein, aspects of the present disclosure can provide substantial improvements or advantages over other solutions by providing a low-distortion analog output circuit that is highly tunable, including gain adjustments, LPF cut-off frequency adjustments, or the like. The analog output circuit can have a high-power supply rejection ratio (PSRR) to tolerate power supply noise. As described herein, aspects of the present disclosure can provide substantial improvements or advantages over other solutions by generating shielded GIP circuit power supply with help of storage capacitors to eliminate additional regulators.

Figure 11:
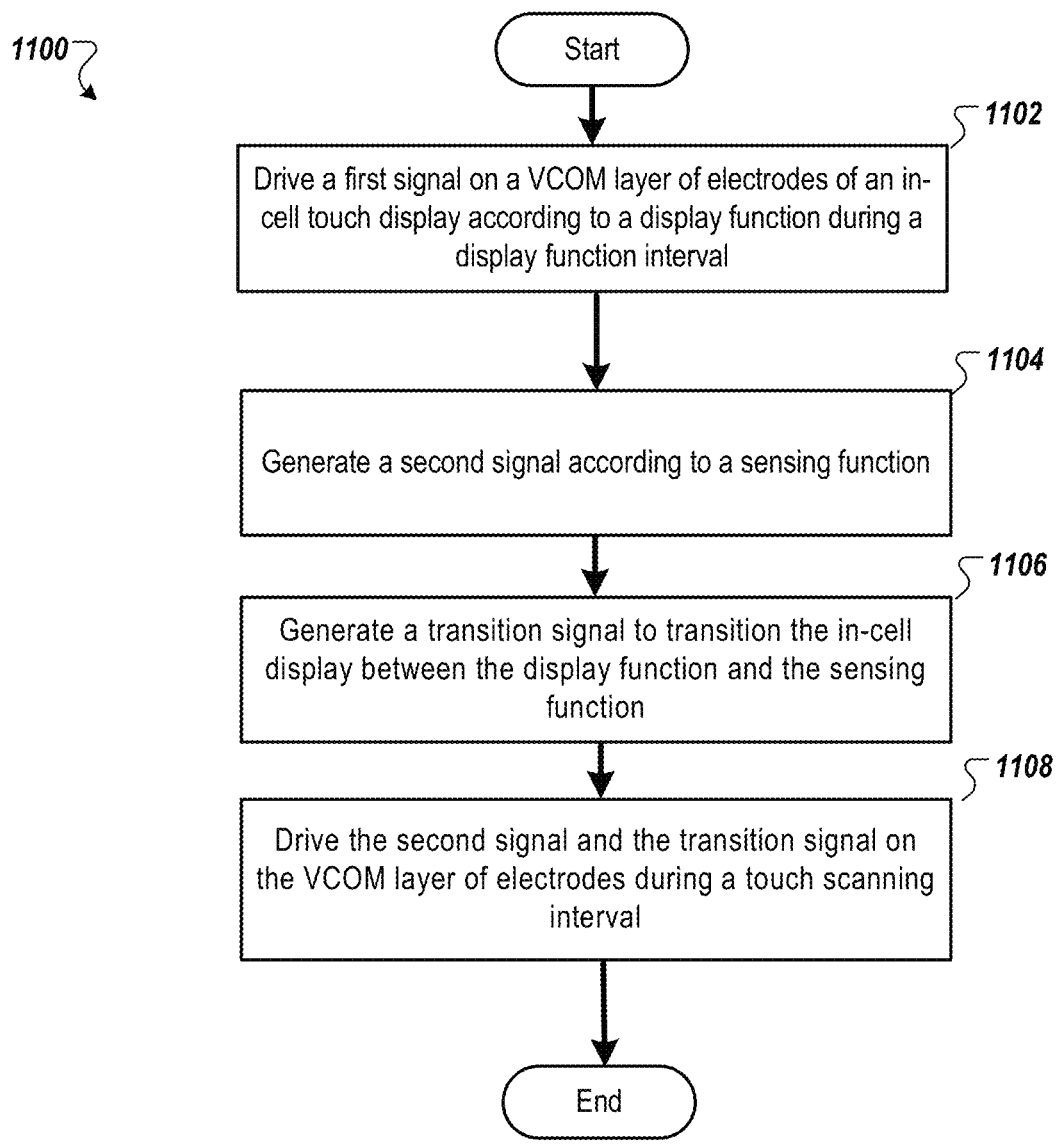
FIG. 11 is a flow diagram of a method of operating an in-cell touch controller according to at least one embodiment.

FIG. 11 is a flow diagram of a method 1100 of operating an in-cell touch controller according to at least one embodiment. The method 1100 may be performed by processing logic that comprises hardware (e.g., circuitry, dedicated logic, programmable logic, microcode, etc.), software, firmware, or a combination thereof. In one embodiment, the method 1100 may be performed by any of the circuits described herein. In one embodiment, the method 1100 is performed by in-cell touch controller 102 of FIG. 1. In another embodiment, the method 1100 is performed by signal generator circuit 500 of FIG. 5 or signal generator circuit 700 of FIG. 7. In another embodiment, the method 1100 is performed by a device that includes the capacitive touch-sensing channel and a processing device coupled to the capacitive touch-sensing channel.

Referring back to FIG. 11, method 1100 begins by the processing logic driving a first signal on a common voltage (VCOM) layer of electrodes of an in-cell touch display according to a display function during a display function interval (block 1102). The processing logic generates a second signal according to a sensing function (block 1104). The second signal includes a windowed sinusoidal waveform. The processing logic generates a transition signal to transition the in-cell display between the display function and the sensing function (block 1106). The processing logic drives the second signal and the transition signal on the VCOM layer during a touch scanning interval (block 1108), and the method 1100 ends.

In a further embodiment, the processing logic combines the transition signal and the second signal into a combined output signal. To drive the second signal and the transition signal, the processing logic drives the combined output signal on the VCOM layer during the touch scanning interval to support the sensing function during a transition to or from the display function.

In another embodiment, the processing logic, to drive the second signal and the transition signal, drives the transition signal during a first segment of the touch scanning interval and drives the second signal during a second segment of the touch scanning interval, the second segment being after the first segment.

In another embodiment, the processing logic, to drive the second signal and the transition signal, drives the transition signal during a first segment of the touch scanning interval and drives the second signal during a second segment of the touch scanning interval, the first segment being after the first segment.

In another embodiment, the processing logic, to drive the second signal and the transition signal, drives a first portion of the transition signal during a first segment of the touch scanning interval, drives a second portion of the transition signal during a second segment of the touch scanning interval, and drives the second signal during a third segment of the touch scanning interval, the third segment being after the first segment and before the second segment.

In another embodiment, the processing logic generates the second signal by modulating the windowed sinusoidal waveform using a SDM. In another embodiment, the processing logic combines the transition signal and the second signal into a combined signal and generates a combined output signal by modulating the combined signal using a SDM in a digital domain. The processing logic generates an analog output signal, based on the combined output signal. To drive the second signal and the transition signal, the processing logic drives the analog output signal on the VCOM layer during the touch scanning interval.

In one embodiment, at block 1104, the processing logic generates the second signal by modulating the windowed sinusoidal waveform using a SDM in a digital domain to obtain a digital output signal and generates the second signal based on the digital output signal using a digitally-controlled potentiometer.

In another embodiment, the processing logic modulates the windowed sinusoidal waveform using a SDM in a digital domain to obtain a digital output signal, combines the digital output signal and the transition signal into a combined output signal, and generates a combined output signal based on the combined output signal using a digitally-controlled potentiometer. To drive the second signal and the transition signal, the processing logic drives the combined output signal.

In one embodiment, to generate the windowed sinusoidal waveform comprises, the processing logic sums a phase value each clock cycle to obtain an accumulated phase value. The processing logic generates a dithering signal based on a pseudo-random number and sums the accumulated phase value and the dithering signal to obtain a phase signal. The processing logic converts the phase signal to an amplitude signal using a LUT and multiples the amplitude signal by a windowing signal to obtain the windowed sinusoidal waveform.

In another embodiment, to combine the transition signal and the second signal into the combined output signal, the processing logic sums a phase value each clock cycle to obtain an accumulated phase value. The processing logic generates a dithering signal based on a pseudo-random number and sums the accumulated phase value and the dithering signal to obtain a phase signal. The processing logic converts the phase signal to an amplitude signal using a LUT and multiples the amplitude signal by a windowing signal to obtain the windowed sinusoidal waveform. The processing logic sums the windowed sinusoidal waveform and the transition signal to obtain the combined output signal.

In another embodiment, to combine the transition signal and the second signal into the combined output signal, the processing logic sums a phase value each clock cycle to obtain an accumulated phase value. The processing logic generates a dithering signal based on a pseudo-random number and sums the accumulated phase value and the dithering signal to obtain a phase signal. The processing logic converts the phase signal to an amplitude signal using a LUT and multiples the amplitude signal by a windowing signal to obtain the windowed sinusoidal waveform. The processing logic modulates the windowed sinusoidal waveform using a SDM in a digital domain to obtain a digital output signal. The processing logic combines the digital output signal and the transition signal to obtain the combined output signal. To drive the second signal and the transition signal, the processing logic outputs the combined output signal using a digitally-controlled potentiometer.

As described herein, the SINEGEN can be part of the in-cell touch-controller and can be used in two supported configurations: in one configuration, the display function-touch scanning transitions and scanning are separated in time as illustrated and described below with respect to FIG. 12; and in another configuration, the touch scanning is combined with the mode changing transition, as illustrated and described below with respect to FIG. 13.

Figure 12:
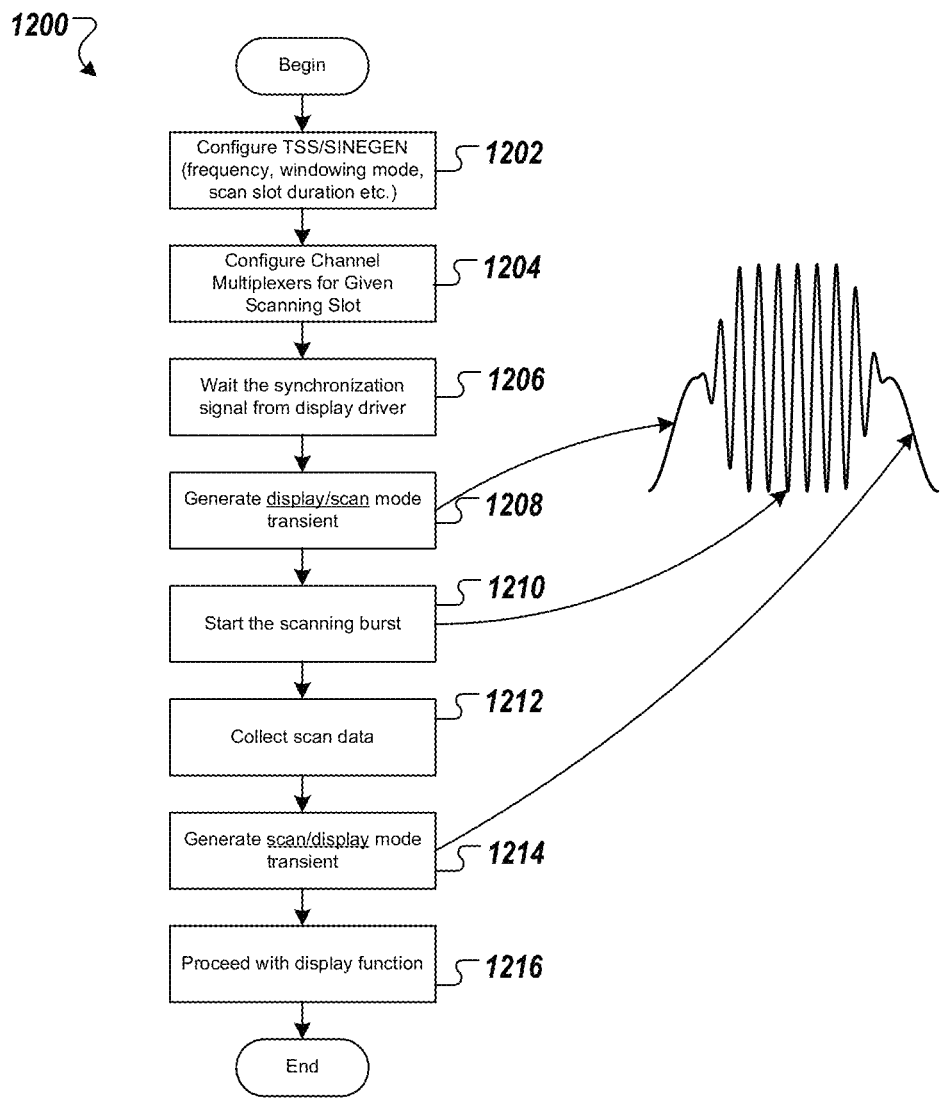
FIG. 12 is a flow diagram of a method of operating an in-cell touch controller with separated scanning and transition signals according to at least one embodiment.

FIG. 12 is a flow diagram of a method 1200 of operating an in-cell touch controller with separated scanning and transition signals according to at least one embodiment. The method 1200 may be performed by processing logic that comprises hardware (e.g., circuitry, dedicated logic, programmable logic, microcode, etc.), software, firmware, or a combination thereof. In one embodiment, the method 1200 may be performed by any of the circuits described herein. In one embodiment, the method 1200 is performed by in-cell touch controller 102 of FIG. 1. In another embodiment, the method 1200 is performed by signal generator circuit 500 of FIG. 5 or signal generator circuit 700 of FIG. 7. In another embodiment, the method 1200 is performed by a device that includes the capacitive touch-sensing channel and a processing device coupled to the capacitive touch-sensing channel.

Referring back to FIG. 12, method 1200 begins by the processing logic configuring parameters of an in-cell touch controller (e.g., Touch Sub System (TSS), which include TX channels and SINEGEN, as well as various supplemental logic circuits, or the like), such as an operating frequency, a windowing mode, a scan slot duration, or the like (block 1202). The processing logic configures channel multiplexers for a given scanning slot (block 1204). The processing logic waits for a synchronization signal from a display driver (block 1206). The processing logic generates a display/scan mode transition signal (block 1208). The processing logic starts a scanning burst (block 1210) and collects scan data (block 1212). The processing logic generates scan/display mode transition signal (block 1214). The processing logic proceeds with the display function (block 1216). The method 1200 can repeat by returning back to block 1208 for the next scanning window.

In this embodiment, the display/scan mode transition signal at block 1208 and the scan/display mode transition signal at block 1214 are separated from the scanning signal in the scanning burst at block 1210.

Figure 13:
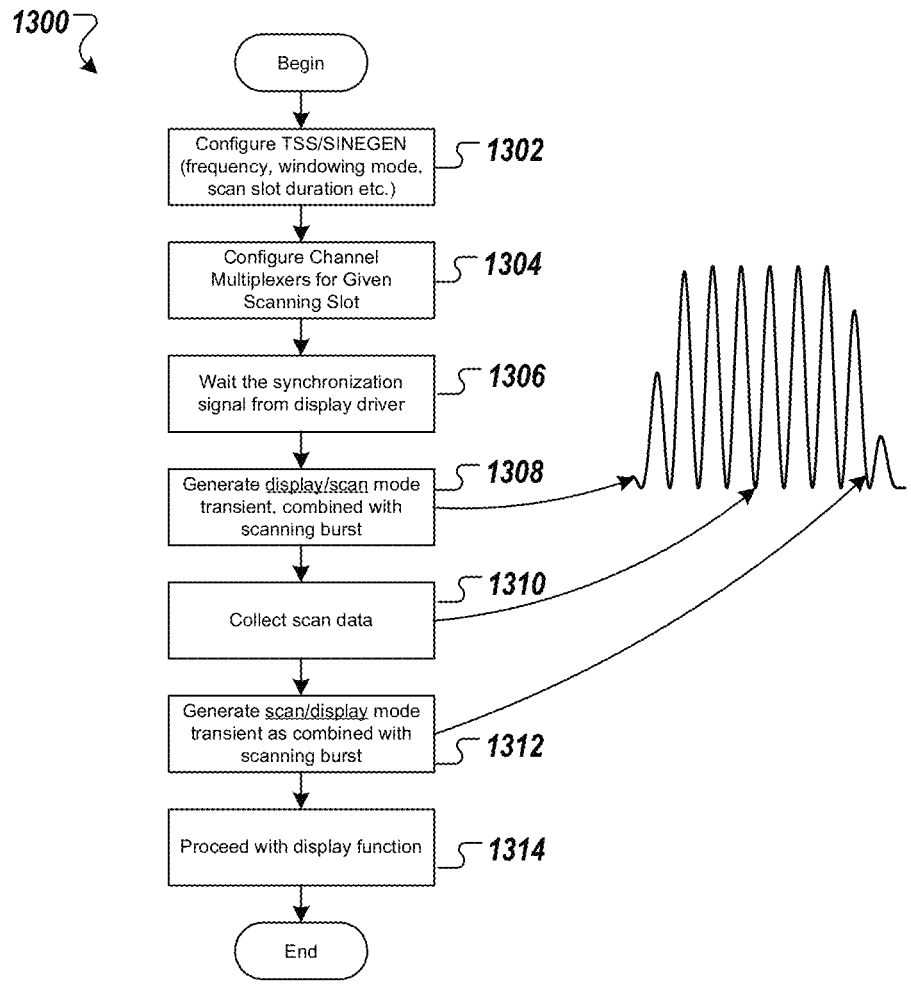
FIG. 13 is a flow diagram of a method of operating an in-cell touch controller with combined scanning and transition signals according to at least one embodiment.

FIG. 13 is a flow diagram of a method 1300 of operating an in-cell touch controller with combined scanning and transition signals according to at least one embodiment. The method 1300 may be performed by processing logic that comprises hardware (e.g., circuitry, dedicated logic, programmable logic, microcode, etc.), software, firmware, or a combination thereof. In one embodiment, the method 1300 may be performed by any of the circuits described herein. In one embodiment, the method 1300 is performed by in-cell touch controller 102 of FIG. 1. In another embodiment, the method 1300 is performed by signal generator circuit 500 of FIG. 5 or signal generator circuit 700 of FIG. 7. In another embodiment, the method 1300 is performed by a device that includes the capacitive touch-sensing channel and a processing device coupled to the capacitive touch-sensing channel.

Referring back to FIG. 13, method 1300 begins by the processing logic configuring parameters of an in-cell touch controller (e.g., TSS/SINEGEN), such as an operating frequency, a windowing mode, a scan slot duration, or the like (block 1302). The processing logic configures channel multiplexers for a given scanning slot (block 1304). The processing logic waits for a synchronization signal from a display driver (block 1306). The processing logic generates a display/scan mode transition signal in combination with a scanning signal in a scanning burst (block 1308). The processing logic collects scan data (block 1310). The processing logic generates scan/display mode transition signal in combination with the scanning signal in the scanning burst (block 1312). The processing logic proceeds with the display function (block 1314). The method 1300 can repeat by returning back to block 1308 for the next scanning window.

In this embodiment, the display/scan mode transition signal at block 1308 and the scan/display mode transition signal at block 1312 are combined with the scanning signal in the scanning burst. The operation sequences are similar in methods 1200 and 1300, except the mode transition and scanning bursts sources operate sequentially in FIG. 12 or simultaneously or concurrently in FIG. 13.

As indicated in FIGS. 12-13, input multiplexers can be used to handle multiple panel sensors, as there can be a smaller number of parallel sensing channels versus a number of electrodes on the panel. For some in-cell touch controllers, the number of electrodes to the number of physical parallel capacitance sense channels can be between ratios of approximately 4:1 to 10:1. Multiple RX channels can be configured for multiple parallel self-capacitance sensing to perform the sensor scanning function during the touch scanning interval. In some embodiments, two synchronously-operating SINEGEN blocks can be used to drive two separate portions of the in-cell touch display, such as illustrated in FIGS. 14A-14C and FIG. 15.

Figure 14A:
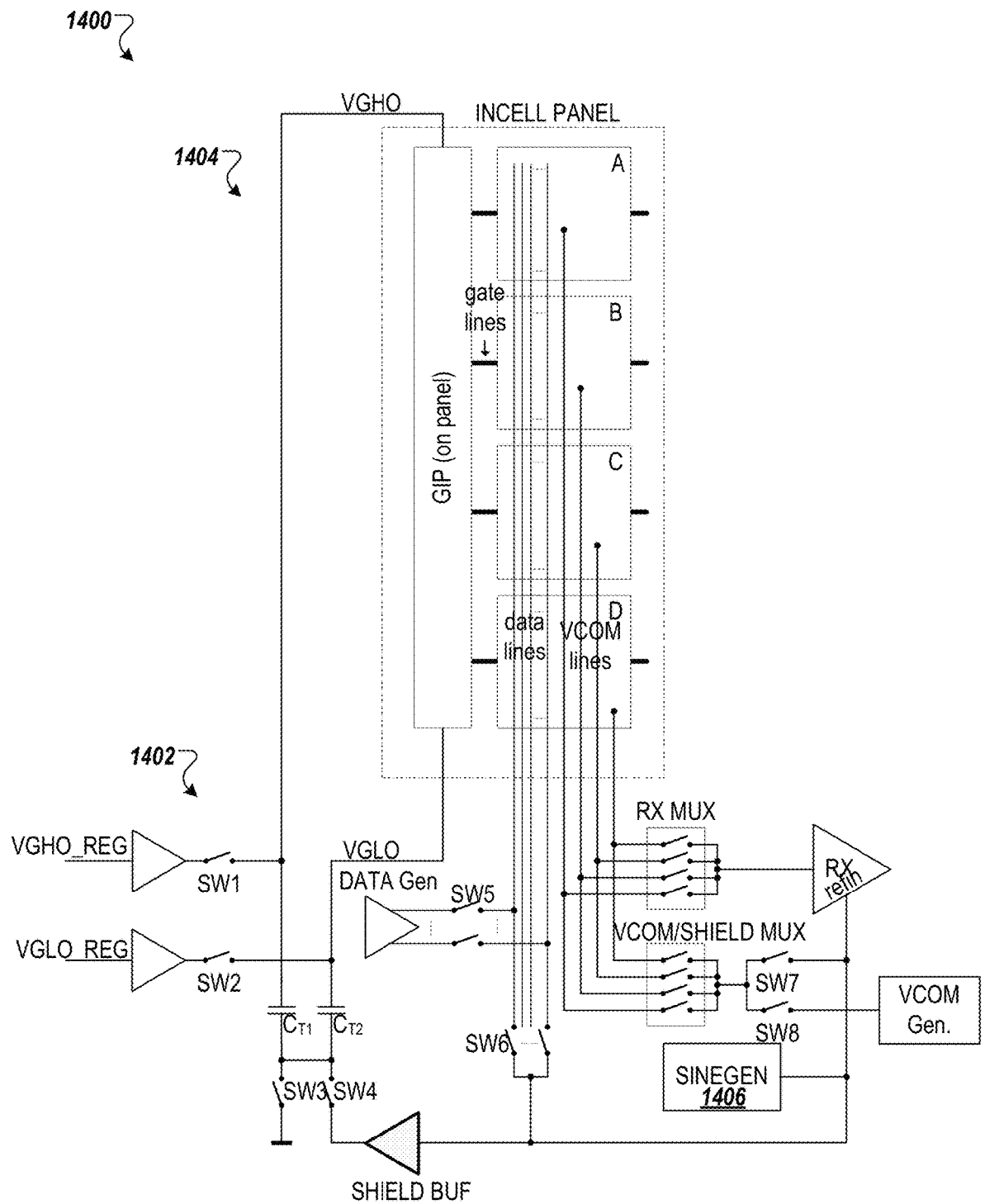
FIG. 14A is a schematic diagram of a system with an in-cell touch controller coupled to a simplified in-cell touch display according to at least one embodiment.
Figure 14B:
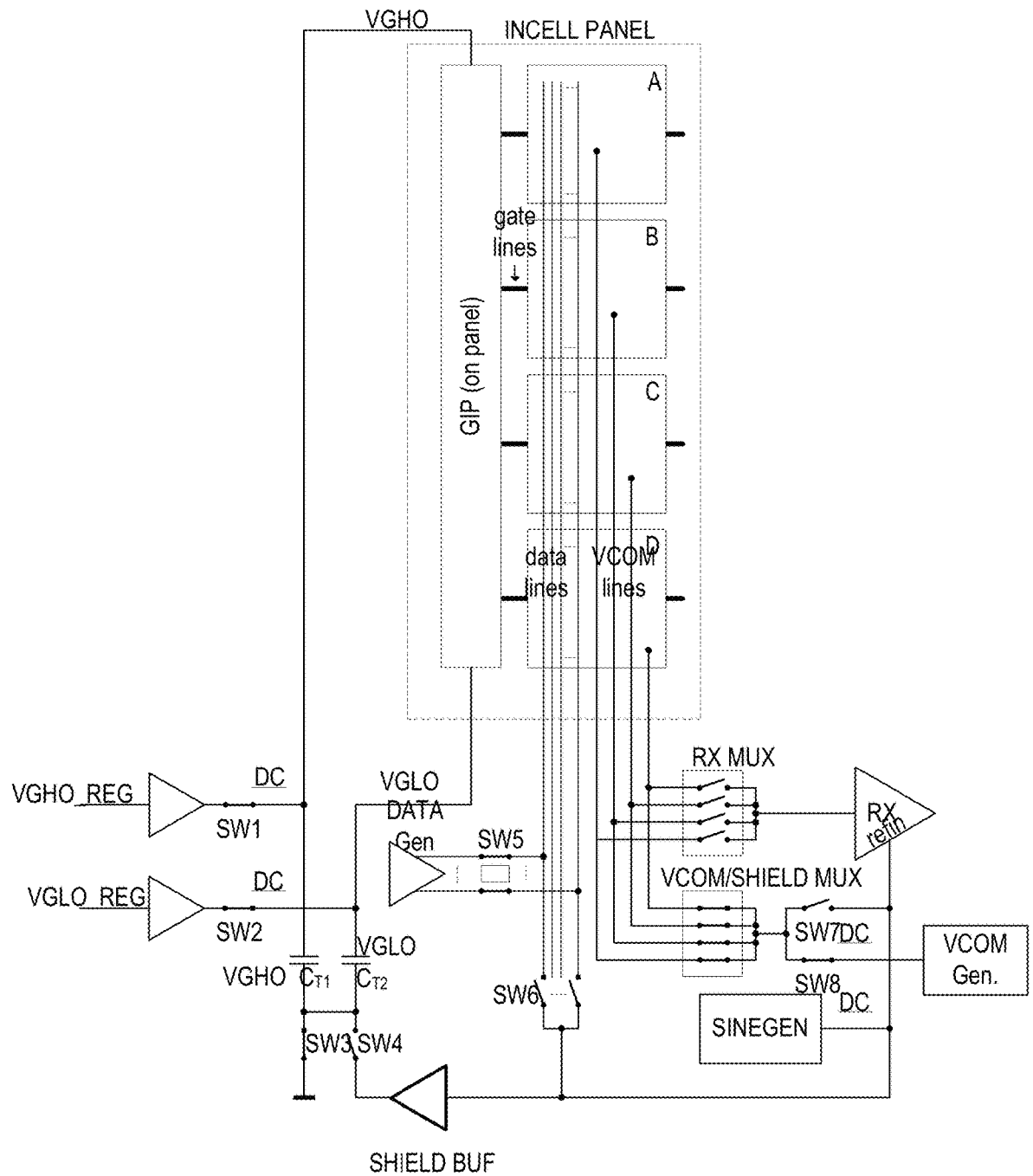
FIG. 14B is a schematic diagram of the system of FIG. 14A during a display function according to at least one embodiment.
Figure 14C:
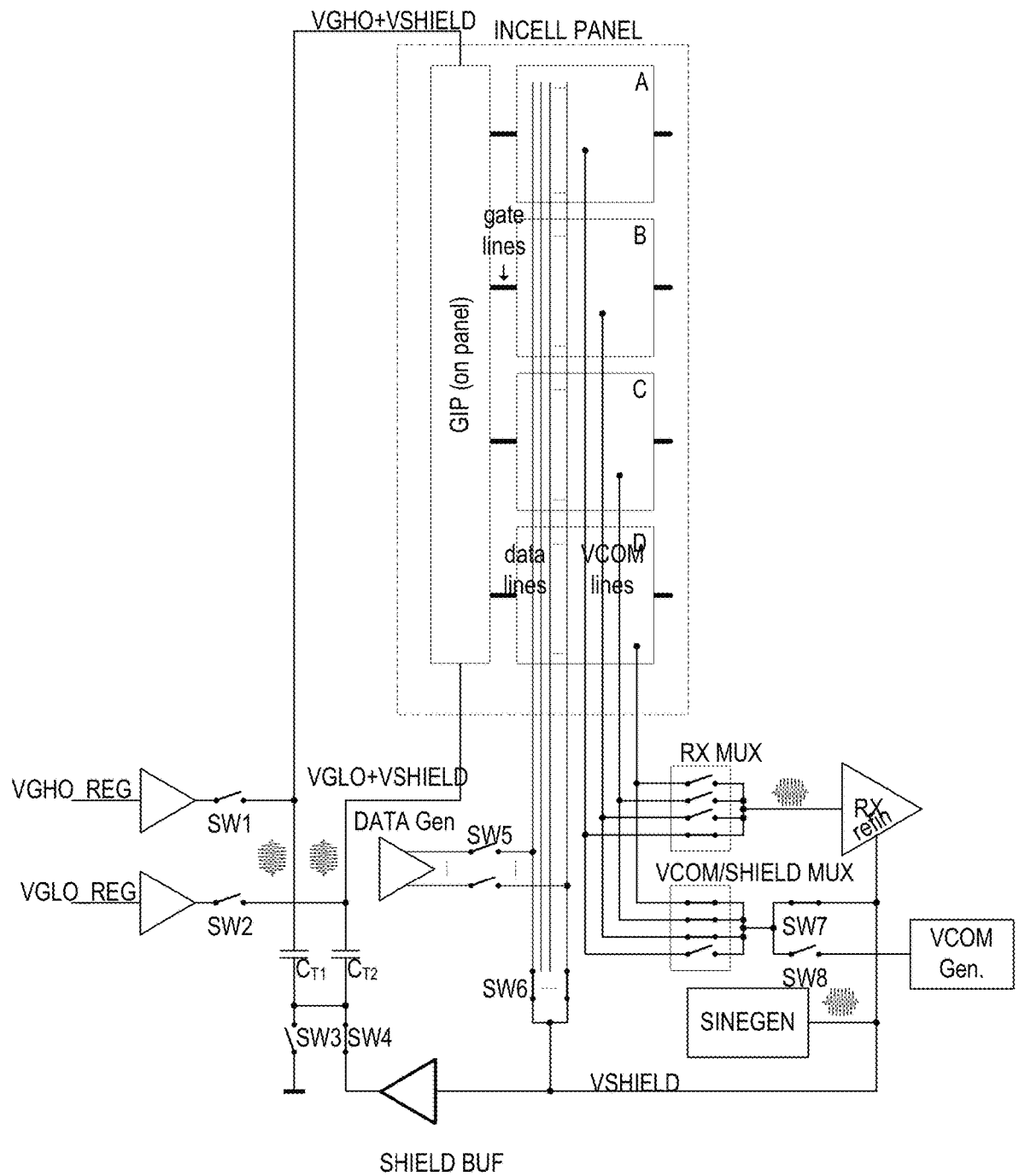
FIG. 14C is a schematic diagram of the system of FIG. 14A during a touch scanning function according to at least one embodiment.

FIG. 14A is a schematic diagram of a system 1400 with an in-cell touch controller 1402 coupled to a simplified version of an in-cell touch display 1400 according to at least one embodiment. FIG. 14A shows the simplified structure for the in-cell touch controller elements, including a smaller count of sensing pad (electrodes in VCOM layer) and only one RX channel for easy of description. In other embodiments, the number of the sensing channels can be more than one and can, in some cases, be substantially higher, from 50 to 200, for example. In-cell touch controller 1402 can be similar to the in-cell touch controllers described above with respect to FIGS. 1-13. In this embodiment, in-cell touch controller 1402 includes a first SINEGEN circuit 1406. First SINEGEN circuit 1406 can generate sense signals and transition signals or combined sense-transition signals for a first portion of in-cell touch display 1404. In one embodiment, first SINEGEN circuit 1406 is configured to generate a sense signal according to a sensing function, such as illustrated in FIG. 14C. The sense signal includes a windowed sinusoidal waveform. Also, first SINEGEN circuit 1406 generates a transition signal to transition at least a first portion of the in-cell touch display 1404 between a display function and a sensing function. First SINEGEN circuit 1406 drives the sense signal and the transition signal on the VCOM layer during the touch scanning interval. In another embodiment, first SINEGEN circuit 1406 combines the transition signal and the sense signal into a combined output signal and drives the combined output signal on the VCOM layer during the touch scanning interval to support the sensing function during a transition to or from the display function.

As illustrated in FIG. 14A, system 1400 includes the following function blocks: In-cell panel with 4 sensors, labeled as A÷D; an single SINEGEN source; shield buffer (either external or internal, implementation dependent); 4-to1 receive channel mux; shield/VCOM mux with arbitrary switches control; single receive (RX) channel; VCOM source, it is a kind of the adjustable DC source; GIP circuit (as part of the in-cell panel); Parallel data lines source;

Regulated power supply for the GIP circuit, provides the VGHO_REG and VGLO_REG DC voltages; External tank capacitors $C_{T1}$, $C_{T2}$; and Analog switches SW1÷SW8 to switch between the display and touch scanning modes. System 1400 can be two time-alternated functions, a display function as illustrated in FIG. 14B and a touch scan function (also referred to herein as a sensing function) as illustrated in FIG. 14C. These functions can be time interlaced. See FIG. 4 for the timing diagrams, including display and touch functions.

FIG. 14B is a schematic diagram of system 1400 of FIG. 14A during a display function according to at least one embodiment. In this function, the RX channel is disconnected from the sense pads, the VCOM is generated with the help of the VCOM DC source. The panel's GIP circuits are powered from the VGHO and VGLO sources respectively. The external tank capacitors $C_{T1}$ and $C_{T2}$ are charged to the VGHO and VGLO DC voltages correspondingly. The parallel panel data signals are going to the data lines by using the DATA Gen source. The SINEGEN block is turned off and does not generate any signals.

FIG. 14C is a schematic diagram of system 1400 of FIG. 14A during a touch scanning function according to at least one embodiment. In this function, the SINEGEN block is activated and generates scan burst. The VCOM source is disconnected and can be turned off if needed to save power. One (A) of the sensors is connected to the sensing channel with the help of the RX mux. The sensing channel reference input is driven by the SINEGEN output and therefore the sensing pad has the same level as SINEGEN output, as sensing channel acts as a unity-gain voltage buffer for the reference signal.

The shield signal is supplied to the remaining 3 sensors (B, C, D) on the panel. So, in this configuration all touch sensors are kept under same potential and sensor capacitances to the gate and data lines are shielded (nulled). The data generator is turned off and SINEGEN output signal is supplied to the data lines as well. Note: in some embodiments the data lines might be kept floating during the touch scan function, this is LCD panel related.

The in-cell panel GIP circuits are powered from the floating power supply, that provides the same amplitude and phase of the AC voltage as the sensor pads and driven by the SINEGEN data lines. The floating power supply is formed with help of the two tank capacitors $C_{T1}$ and $C_{T2}$, where their bottom terminals are driven by the SINEGEN output. Note: those capacitors have been pre-charged to the VGHO and VGLO levels during display function state and DC voltage change over scan cycle due to the GIP circuits power consumption is insignificant and neither has impact on the scanning performance nor the display function. Other embodiments might use different implementations for the gate drivers floating power supply implementation, e.g. the summing amplifiers/buffers.

Taking into account we have much less sensing RX channels vs. sensing pads in the display, we need to scan different sensors in series using same sensing channel. The various sensors are scanned in the different sensing slots, which triggered by the HSYNC signal (see FIG. 4 in the main patent application). In this simplified example, we have four sensors that are scanned by one sensing channel (multiplexing ratio is 4:1), but in the typical in-cell panel multiplexing ratio is 1:8-1:10 or so.

The sensing channel alternatively is connected to the various sensors, one at the time, and the shield signal is supplied to the remaining three sensors with help of the VCOM/SHIELD MUX.

Figure 15:
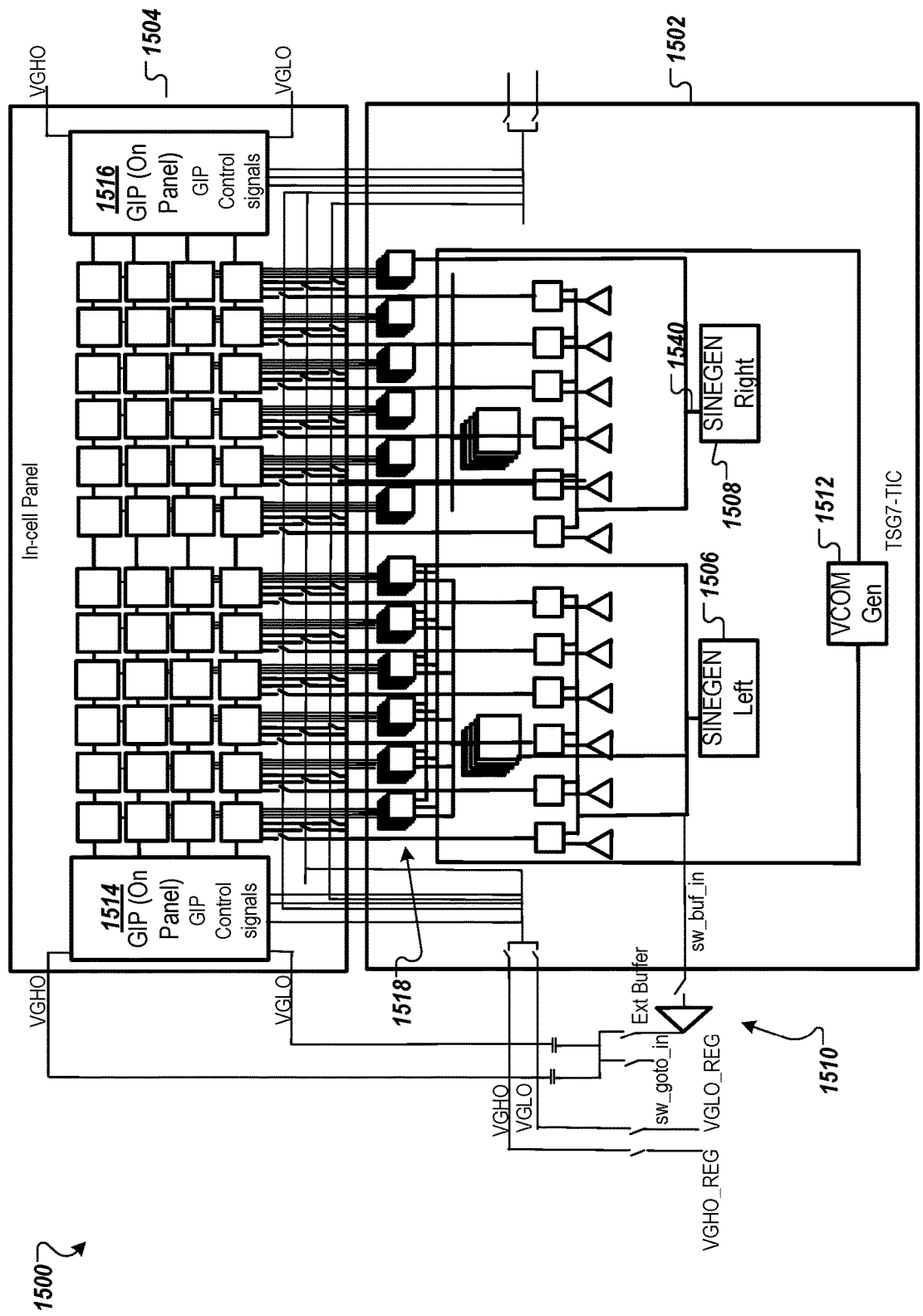
FIG. 15 is a schematic diagram of a system with an in-cell touch controller coupled to an in-cell touch display according to at least one embodiment.

FIG. 15 is a schematic diagram of a system 1500 with an in-cell touch controller 1502 coupled to an in-cell touch display 1504 according to at least one embodiment. In-cell touch controller 1502 can be similar to the in-cell touch controllers described above with respect to FIGS. 1-14. In this embodiment, the in-cell touch controller 1502 includes two SINEGEN circuits 1506, 1508. First SINEGEN circuit 1506 can generate sense signals and transition signals or combined sense-transition signals for a first portion of the in-cell touch display 1504. Second SINEGEN circuit 1508 can generate sense signals and transition signals or combined sense-transition signals for a second portion of the in-cell touch display 1504. In one embodiment, first SINEGEN circuit 1506 is configured to generate a sense signal according to the sensing function. The sense signal includes a windowed sinusoidal waveform. Also, first SINEGEN circuit 1506 generates a transition signal to transition at least a first portion of the in-cell touch display 1504 between the display function and the sensing function. First SINEGEN circuit 1506 drives the sense signal and the transition signal on the VCOM layer during the touch scanning interval. In another embodiment, first SINEGEN circuit 1506 combines the transition signal and the sense signal into a combined output signal and drives the combined output signal on the VCOM layer during the touch scanning interval to support the sensing function during a transition to or from the display function. Second SINEGEN circuit 1508 is configured to generate a second sense signal according to the sensing function. The second sense signal includes a windowed sinusoidal waveform. Second SINEGEN circuit 1508 generates a second transition signal to transition at least a second portion of the in-cell touch display 1504 between the display function and the sensing function. Second SINEGEN circuit 1508 drives the second sense signal and the second transition signal on the VCOM layer during the touch scanning interval. First SINEGEN circuit 1506 and second SINEGEN circuit 1508 operate synchronously. In a further embodiment, Second SINEGEN circuit 1508 combines the second sense signal and the second transition signal into a combined output signal and drives the combined output signal on the VCOM layer during the touch scanning interval to support the sensing function during a transition to or from the display function. The two SINEGEN blocks can be used for the precision phase and amplitude adjustment across large in-cell panel and it also simplifies overall chip layout, taking into account the TTDI chip is very narrow (2 mm) and long (e.g. 35 mm).

An external high-power buffer 1510 can be used for the shield signal(s). For example, two storage capacitors can be used to generate AC-shielded GIP circuit signals during a touch scanning interval. During a display function, the GIP power supplies (e.g., VGHO_REG, VGLO_REG) can be generated with voltage regulators. A VCOM source 1512 can be used to provide a VCOM level for the in-cell touch display 1504. Unlike on-stack touch sensors within displays, the in-cell panel itself can include an array of TFT transistors and built-in GIP drivers 1514, 1516 on the glass of the in-cell touch display 1504. The in-cell touch display 1504 has a glass panel with integrated sensors (electrodes). As described above, the in-cell touch controller 1502 can include input multiplexers 1518 to couple the electrodes to a receiver (RX) channel that measure charge and converts the charge to digital values for further processing, such as touch coordinates, gesture recognition, or the like.

The system 1500 can include one or more TDDI chips (including the in-cell touch controllers described herein). When there are multiple in-cell touch controllers, one of them can operate as a master to initiate a scan function and provides synchronization signals to the other slave touch controllers. The master controller can scan some panel area and the remaining area can be scanned by the slave controller(s). In some cases, touch data comes from a master in-cell touch controller and is processed locally and no external central processing unit (CPU) for the touch coordinates is needed. In other cases, the touch controller(s) can offload these computations to another processing element where the single master collects and processes data from multiple TDDI chips in parallel. This separation might have multiple design advantages, e.g. using the high-voltage CMOS technology for the TDDI chip and low-voltage for the CPU chip.

Figure 16:
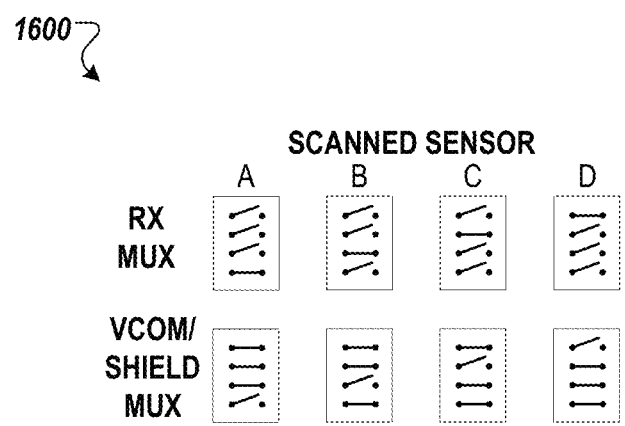
FIG. 16 illustrates mux configurations for scanning several sensors with a single RX channel according to at least one embodiment.

As described above, the sensing channel alternatively is connected to the various sensors, one at the time, and the shield signal is supplied to the remaining three sensors with help of the VCOM/SHIELD MUX, as illustrated in FIG. 16.

FIG. 16 illustrates mux configurations 1600 for scanning several sensors with a single RX channel according to at least one embodiment. In one common embodiment, scanning one sensor is triggered by the one HSYNC pulse (see FIG. 4) for the typical panel. In other embodiments (which display panels that might accept the long scanning intervals) can scan more than one sensor (e.g. 2) in series per one HSYNC pulse. In this case the TDDI chip internal state machine performs the seamless sensor switching. When more than one sensor is scanned in the one slot, only one window burst is needed, it enables getting stronger touch signal and reduces the panel emission central peak width.

In the above description, some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining", "allocating," "dynamically allocating," "redistributing," "ignoring," "reallocating," "detecting," "performing," "polling," "registering," "monitoring," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an embodiment" or "one embodiment" throughout is not intended to mean the same embodiment or embodiment unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The methods and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods, and so forth, in order to provide a good understanding of several embodiments of the present disclosure. It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
driving, by an in-cell touch controller in a touch scanning interval of a first mode, a sensing signal on a common voltage (VCOM) electrode of an in-cell touch unit, wherein the sensing signal comprises a windowed sinusoidal waveform and a transition waveform to transition the in-cell touch unit between the first mode and a second mode; and
driving, by the in-cell touch controller in the second mode, a display signal on the VCOM electrode.

2. The method of claim 1, further comprising:
generating, by the in-cell touch controller, a first signal comprising the windowed sinusoidal waveform;
generating, by the in-cell touch controller, a second signal comprising the transition waveform; and
combining the first signal and the second signal into a combined output signal, wherein driving the sensing signal comprises driving the combined output signal as the sensing signal on the VCOM electrode during the touch scanning interval.

3. The method of claim 2, further comprising wherein driving the combined output signal enables a sensing function during a transition to or from the second mode.

4. The method of claim 1, further comprising:
generating, by the in-cell touch controller, a first signal comprising the windowed sinusoidal waveform;
generating, by the in-cell touch controller, a second signal comprising the transition waveform;
combining the first signal and the second signal into an intermediate signal; and
modulating the intermediate signal using a sigma-delta modulator (SDM) in a digital domain to obtain a combined output signal; and
generating an analog output signal based on the combined output signal, wherein driving the sensing signal comprises driving analog output signal as the sensing signal.

5. The method of claim 1, wherein:
generating, by the in-cell touch controller, the windowed sinusoidal waveform;
modulating the windowed sinusoidal waveform using a sigma-delta modulator (SDM) in a digital domain to obtain a first signal comprising the windowed sinusoidal waveform;
generating, by the in-cell touch controller, a second signal comprising the transition waveform;
combining the first signal and the second signal to obtain a combined output signal; and
generating an analog output signal based on the combined output signal, wherein driving the sensing signal comprises driving analog output signal as the sensing signal.

6. The method of claim 1, further comprising:
modulating the windowed sinusoidal waveform using a sigma-delta modulator (SDM) in a digital domain to obtain a first signal comprising the windowed sinusoidal waveform;
generating, by the in-cell touch controller, a second signal; and
generating, using a digitally-controlled potentiometer controlled by the second signal, the sensing signal based on the first signal, wherein the sensing signal comprises the windowed sinusoidal waveform and the transition waveform.

7. The method of claim 1, wherein driving the sensing signal comprises:
driving the windowed sinusoidal waveform during a first segment of the touch scanning interval; and
driving the transition waveform during a second segment of the touch scanning interval, wherein the second segment is after the first segment.

8. The method of claim 1, wherein driving the sensing signal comprises:
driving the windowed sinusoidal waveform during a first segment of the touch scanning interval; and
driving the transition waveform during a second segment of the touch scanning interval, wherein the first segment is after the first segment.

9. The method of claim 1, wherein driving the sensing signal comprises:
driving a first portion of the transition waveform during a first segment of the touch scanning interval;
driving the windowed sinusoidal waveform during a second segment of the touch scanning interval; and
driving a second portion of the transition waveform during a third segment of the touch scanning interval, wherein the second segment is after the first segment and the third segment is after the second segment.

10. The method of claim 1, further comprising generating the sensing signal by modulating the windowed sinusoidal waveform using a sigma-delta modulator (SDM).

11. The method of claim 1, further comprising:
summing, by a phase accumulator, a phase value each clock cycle to obtain an accumulated phase value;
generating, by a dithering circuit, a dithering signal based on a pseudo-random number;
summing the accumulated phase value and the dithering signal to obtain a phase signal;
converting the phase signal to an amplitude signal using a look-up table (LUT); and
multiplying the amplitude signal by a windowing signal to obtain the windowed sinusoidal waveform.

12. The method of claim 1, further comprising:
generating, by the in-cell touch controller, a first signal comprising the windowed sinusoidal waveform;
generating, by the in-cell touch controller, a second signal comprising the transition waveform; and
combining the first signal and the second signal into a combined output signal, wherein driving the sensing signal comprises driving the combined output signal comprises:
summing, by a phase accumulator, a phase value each clock cycle to obtain an accumulated phase value;
generating, by a dithering circuit, a dithering signal based on a pseudo-random number;
summing the accumulated phase value and the dithering signal to obtain a phase signal;
converting the phase signal to an amplitude signal using a look-up table (LUT);
multiplying the amplitude signal by a windowing signal to obtain the windowed sinusoidal waveform; and
summing the windowed sinusoidal waveform and the transition waveform to obtain the combined output signal.

13. The method of claim 1, further comprising:
generating, by the in-cell touch controller, a first signal comprising the windowed sinusoidal waveform;
generating, by the in-cell touch controller, a second signal comprising the transition waveform; and combining the first signal and the second signal into a combined output signal, wherein driving the sensing signal comprises driving the combined output signal comprises:
- summing, by a phase accumulator, a phase value each clock cycle to obtain an accumulated phase value;
- generating, by a dithering circuit, a dithering signal based on a pseudo-random number;
- summing the accumulated phase value and the dithering signal to obtain a phase signal;
- converting the phase signal to an amplitude signal using a look-up table (LUT);
- multiplying the amplitude signal by a windowing signal to obtain the windowed sinusoidal waveform; and
- modulating the windowed sinusoidal waveform using a sigma-delta modulator (SDM) in a digital domain to obtain a digital output signal; and
- combining the digital output signal and the transition waveform to obtain the combined output signal, and wherein driving the sensing signal comprises outputting the combined output signal using a digitally-controlled potentiometer.

14. An in-cell touch controller comprising:
touch driver circuitry configured to:
- drive, in a touch scanning interval of a first mode, a sensing signal on a common voltage (VCOM) electrode of an in-cell touch unit, wherein the sensing signal comprises a windowed sinusoidal waveform and a transition waveform to transition the in-cell touch unit between the first mode and a second mode; and
- drive, in the second mode, a display signal on the VCOM electrode.

15. The in-cell touch controller of claim 14, wherein the touch driver circuitry is further configured to:
- generate a first signal comprising the windowed sinusoidal waveform;
- generate a second signal comprising the transition waveform; and
- combine the first signal and the second signal into a combined output signal, wherein the combined output signal is the sensing signal.

16. The in-cell touch controller of claim 14, wherein the touch driver circuitry comprises a direct digital synthesis (DDS) circuit.

17. The in-cell touch controller of claim 16, wherein the DDS circuit comprises a plurality of functional blocks comprising:
- a phase accumulator;
- a first summer;
- a phase-to-amplitude converter comprising a look-up table (LUT);
- a multiplier;
- a sigma-delta modulator (SDM); and
- a low pass filter (LPF).

18. The in-cell touch controller of claim 14, wherein the touch driver circuitry comprises a direct digital synthesis (DDS) circuit and a digitally-controlled potentiometer.

19. A system comprising:
- an in-cell touch display comprising a common voltage (VCOM) electrode of an in-cell touch unit configured to operate in a first mode and a second mode; and
- touch driver circuitry coupled to the VCOM electrode and configured to:
  - drive, in a touch scanning interval of the first mode, a sensing signal on the VCOM electrode, wherein the sensing signal comprises a windowed sinusoidal waveform and a transition waveform to transition the in-cell touch unit between the first mode and the second mode; and
  - drive, in the second mode, a display signal on the VCOM electrode.

20. The system of claim 19, wherein the touch driver circuitry is further configured to:
- generate a first signal comprising the windowed sinusoidal waveform;
- generate a second signal comprising the transition waveform; and
- combine the first signal and the second signal into a combined output signal, wherein the combined output signal is the sensing signal.

21. The system of claim 19, wherein the touch driver circuitry comprises a direct digital synthesis (DDS) circuit with a plurality of functional blocks comprising:
- a phase accumulator;
- a first summer;
- a phase-to-amplitude converter comprising a look-up table (LUT);
- a multiplier;
- a sigma-delta modulator (SDM); and
- a low pass filter (LPF).

* * * * *